(12) United States Patent
Ryu

(10) Patent No.: US 8,952,717 B2
(45) Date of Patent: Feb. 10, 2015

(54) LED CHIP TESTING DEVICE

(75) Inventor: Beng So Ryu, Incheon (KR)

(73) Assignee: QMC Co., Ltd., Gunposi (KR)

( * ) Notice: Subject to any disclaimer, the term of this patent is extended or adjusted under 35 U.S.C. 154(b) by 621 days.

(21) Appl. No.: 13/148,980

(22) PCT Filed: Dec. 24, 2009

(86) PCT No.: PCT/KR2009/007809
§ 371 (c)(1),
(2), (4) Date: Aug. 11, 2011

(87) PCT Pub. No.: WO2010/095809
PCT Pub. Date: Aug. 26, 2010

(65) Prior Publication Data
US 2011/0316579 A1    Dec. 29, 2011

(30) Foreign Application Priority Data

Feb. 20, 2009 (KR) .................. 10-2009-0014471
Mar. 18, 2009 (KR) .................. 10-2009-0023030
Jun. 29, 2009 (KR) .................. 10-2009-0058292
Nov. 24, 2009 (KR) .................. 10-2009-0114028

(51) Int. Cl.
*G01R 31/26* (2014.01)
*G01R 31/308* (2006.01)
*B23Q 7/12* (2006.01)
*B07C 5/02* (2006.01)
*G01R 31/28* (2006.01)

(52) U.S. Cl.
CPC ........ *G01R 31/2635* (2013.01); *G01R 31/2887* (2013.01); *G01R 31/2893* (2013.01)

USPC ............ 324/762.07; 324/762.02; 324/754.23; 221/173; 209/538; 209/573

(58) Field of Classification Search
CPC ............. G01R 31/2632; G01R 31/343; G01R 31/2635; G01R 31/44; G01R 31/2607
USPC ............... 324/762.07; 201/173; 209/538, 573
See application file for complete search history.

(56) References Cited

U.S. PATENT DOCUMENTS

| | | | | |
|---|---|---|---|---|
| 2,967,642 A | * | 1/1961 | Curry | 221/173 |
| 2,999,587 A | * | 9/1961 | Campbell | 209/539 |
| 3,115,235 A | * | 12/1963 | Othon | 198/395 |
| 3,238,455 A | * | 3/1966 | Jankowski | 324/756.05 |
| 3,252,571 A | * | 5/1966 | Hinkle et al. | 198/399 |
| 3,702,438 A | * | 11/1972 | Cole, Jr. | 324/762.07 |
| 3,742,356 A | * | 6/1973 | Brock | 324/762.07 |
| 4,179,032 A | * | 12/1979 | Artz et al. | 209/538 |

(Continued)

FOREIGN PATENT DOCUMENTS

| JP | 53-094774 | 8/1978 |
|---|---|---|
| JP | 62-052941 | 3/1987 |

(Continued)

*Primary Examiner* — Jermele M Hollington
*Assistant Examiner* — Christopher McAndrew
(74) *Attorney, Agent, or Firm* — Lexyoume IP Meister, PLLC

(57) ABSTRACT

The present invention provides an LED chip testing device that measures characteristics of an LED chip.

The LED chip testing device includes: a rotation member that supports the LED chip and rotates the LED chip to a testing position where the characteristics of the LED chip are tested; and a tester installed next to the rotation member and serving to measure the characteristics of the LED chip at the testing position.

11 Claims, 33 Drawing Sheets

(56) References Cited

U.S. PATENT DOCUMENTS

| | | | |
|---|---|---|---|
| 4,433,898 A * | 2/1984 | Nasiri | 385/91 |
| 4,500,003 A * | 2/1985 | Cedrone | 209/573 |
| 4,611,116 A * | 9/1986 | Batt | 250/239 |
| 4,611,119 A * | 9/1986 | Fazekas et al. | 250/307 |
| 4,775,640 A * | 10/1988 | Chan | 438/16 |
| 5,381,103 A * | 1/1995 | Edmond et al. | 324/754.06 |
| 5,764,673 A * | 6/1998 | Kawazu et al. | 372/45.01 |
| 5,793,220 A * | 8/1998 | Thompson, Sr. | 324/756.02 |
| 6,043,668 A * | 3/2000 | Carney | 324/750.24 |
| 6,087,846 A * | 7/2000 | Alvord et al. | 324/750.3 |
| 6,384,612 B2 * | 5/2002 | Freund et al. | 324/754.23 |
| 6,564,161 B1 * | 5/2003 | Lin et al. | 702/117 |
| 6,597,195 B1 * | 7/2003 | Beaudry et al. | 324/750.05 |
| 6,797,936 B1 * | 9/2004 | Kessler et al. | 250/221 |
| 7,030,642 B2 * | 4/2006 | Butsch et al. | 324/750.09 |
| 7,109,739 B2 * | 9/2006 | Gothoskar et al. | 324/754.23 |
| 7,148,719 B2 * | 12/2006 | Lee et al. | 324/754.23 |
| 7,374,293 B2 * | 5/2008 | Li et al. | 324/754.07 |
| 7,382,148 B2 * | 6/2008 | Dang et al. | 324/762.07 |
| 7,439,731 B2 * | 10/2008 | Crafts et al. | 324/756.03 |
| 7,538,359 B2 * | 5/2009 | Eng et al. | 257/98 |
| 7,652,480 B2 * | 1/2010 | Mollet | 324/522 |
| 7,679,101 B2 * | 3/2010 | Ota et al. | 257/100 |
| 7,755,838 B2 * | 7/2010 | Chaves et al. | 359/636 |
| 7,804,589 B2 * | 9/2010 | Tseng et al. | 356/213 |
| 7,868,637 B2 * | 1/2011 | Avritch et al. | 324/762.07 |
| 2005/0174808 A1 * | 8/2005 | Butsch et al. | 362/652 |
| 2005/0225309 A1 * | 10/2005 | Ikegame | 324/96 |
| 2008/0098833 A1 * | 5/2008 | Sasaki et al. | 73/865.9 |
| 2008/0284329 A1 * | 11/2008 | Bertram et al. | 313/506 |
| 2009/0046456 A1 * | 2/2009 | Urano et al. | 362/235 |
| 2012/0138967 A1 * | 6/2012 | Shimizu et al. | 257/88 |
| 2013/0249579 A1 * | 9/2013 | Lin et al. | 324/750.13 |

FOREIGN PATENT DOCUMENTS

| | | |
|---|---|---|
| JP | 06-064180 | 9/1994 |
| JP | 07-037946 | 2/1995 |
| JP | 2004-301807 | 10/2004 |
| JP | 2007-019237 | 1/2007 |
| JP | 2008-070308 | 3/2008 |
| KR | 10-2007-0039994 | 4/2007 |

* cited by examiner

LED CHIP TESTING DEVICE

FIELD OF THE INVENTION

The present invention relates to an LED chip testing device that tests LED chips to investigate their performance.

BACKGROUND OF THE INVENTION

A light emitting diode (LED) is a kind of semiconductor light emitting device that converts electricity to light. The LED is also called a luminescent diode. The LED presents many advantages over conventional light sources, including smaller size, longer lifetime, low power consumption and high-speed responsiveness. Thus, the LED has been widely utilized in various applications such as a display device for an automotive instrument, a display lamp for various electronic devices such as an optical communication light source, a card reader for a numeric display device or a calculator, a backlight, and so forth.

The LED is manufactured through an EPI process, a chip process (fabrication) and a packaging process. The LED is subjected to a testing process after it is packaged through the packaging process. In the testing process, LEDs that do not operate normally (hereinafter, referred to as "inferior goods") are excluded, and LEDs that operate normally (hereinafter, referred to as "fine goods") are sorted into multiple classes depending on their performance and are then subjected to shipment.

Here, in the testing process, LEDs may be excluded as inferior goods or sorted into a lower class due to a problem caused during the packaging process, and they may be excluded as the inferior goods or sorted into the lower class due to a problem generated during the fabrication process in which they are fabricated in chip states (hereinafter, referred to as "LED chips") before undergone through the packaging process.

That is, even in case no problem that affects the performance of LEDs is generated in the packaging process, the LEDs can be found to be inferior goods or sorted into lower classes due to the problems that are generated while the LED chips are fabricated.

The LEDs that are excluded as the inferior goods in the testing process due to the problems caused when the LED chips are fabricated are undergone through the packaging process and the testing process unnecessarily. As they undergo through the unnecessary processes, loss in material costs and process costs may be caused.

For LEDs that are sorted into lower classes due to the problems caused during the LED chips are fabricated, the reason that they are sorted into the lower classes may be sought for in the packing process. As a result, it has been time-consuming and cost ineffective in obtaining accurate analysis results.

The above-mentioned problems may result in an increase of a unit cost for the manufacture of products using LEDs as well as an increase of a unit cost for the manufacture of LEDs.

BRIEF SUMMARY OF THE INVENTION

In view of the foregoing, the present invention provides an LED chip testing device capable of testing performance of LED chips accurately.

To achieve the aforementioned object, the present invention may include the following configurations.

In accordance with an embodiment of the present invention, there is provided an LED chip testing device that measures characteristics of an LED chip. The LED chip testing device includes: a rotation member that supports the LED chip and rotates the LED chip to a testing position where the characteristics of the LED chip are tested; and a tester installed next to the rotation member and serving to measure the characteristics of the LED chip at the testing position.

In accordance with an embodiment of the present invention, the rotation member may include: a plurality of supporting frames extending in radial directions with respect to a rotational axis; and a plurality of mounting members, each of which is installed at an end portion of corresponding one of the plurality of supporting frames and serves to mount thereon the LED chip.

In accordance with an embodiment of the present invention, the entire or a part of the mounting member may be made of a material containing any one of sapphire, crystal, glass, a ferroalloy, a copper alloy, an aluminum allow, stainless steel, a hard metal, PTFE (polytetrafluoroethylene), gold, platinum and silver. And, the entire or a part of the mounting member may be covered with a mirror coating, or plated with gold, platinum or silver.

In accordance with an embodiment of the present invention, the mounting member may include: a mounting body coupled to the rotation member; and a contact member that comes into contact with the LED chip. And, the contact member may be made of sapphire and a contact member's surface facing the mounting body is covered with a mirror coating.

In accordance with an embodiment of the present invention, the tester may include: a contact unit that comes into contact with the LED chip at the testing position and thus makes the LED chip light emit; and a measurement unit that measures an optical characteristic of the LED chip at the testing position.

In accordance with an embodiment of the present invention, the LED chip testing device may further include a conveyance member that conveys the light emitted from the LED chip to the tester.

In accordance with an embodiment of the present invention, the conveyance member may include a conveyance surface that conveys the light emitted from the LED chip to the measurement unit, and the conveyance surface may be provided with a passing hole through which the light emitted from the LED chip passes.

In accordance with an embodiment of the present invention, the size of the passing hole may be gradually reduced in a direction facing toward the LED chip located at the testing position from the measurement unit.

In accordance with an embodiment of the present invention, the entire or a part of the conveyance surface may be covered with a mirror coating.

In accordance with an embodiment of the present invention, the contact unit may include a detachable contact pin that is brought into contact with the LED chip. And, the contact unit may be a probe card.

In accordance with an embodiment of the present invention, the measurement unit may be an integrating sphere having a light receiving hole through which the light emitted from the LED chip at the testing position is introduced into the inside of the integrating sphere.

In accordance with an embodiment of the present invention, the tester may further include a contact movement unit that moves the contact unit. And, the contact movement unit may include a contact rotation mechanism that rotates the contact unit.

In accordance with an embodiment of the present invention, the tester may further include a measurement elevation unit that elevates the measurement unit up and down.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of an LED chip testing device in accordance with the present invention will be described in detail with reference to the accompanying drawings.

Figure 1:
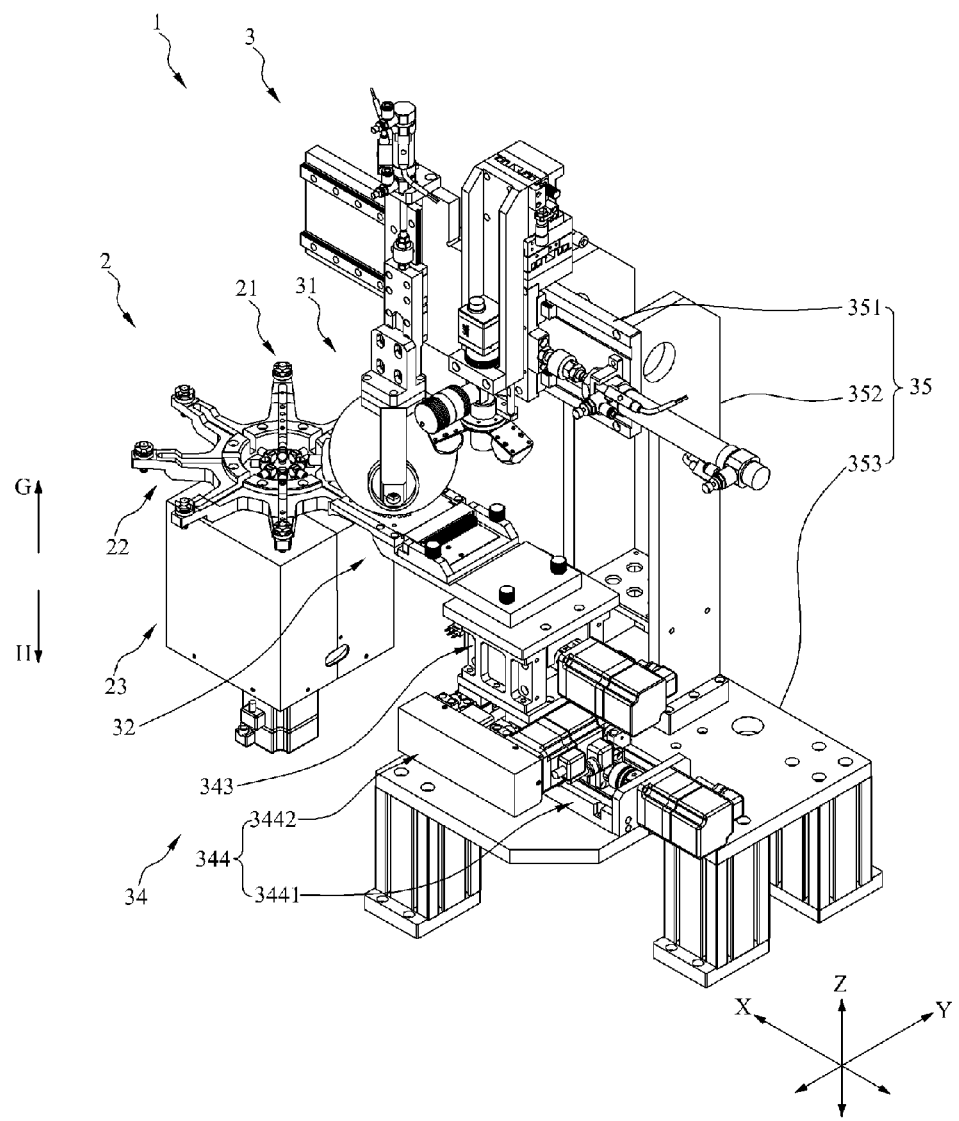
FIG. 1 is a schematic perspective view of an LED chip testing device in accordance with the present invention.
Figure 8:
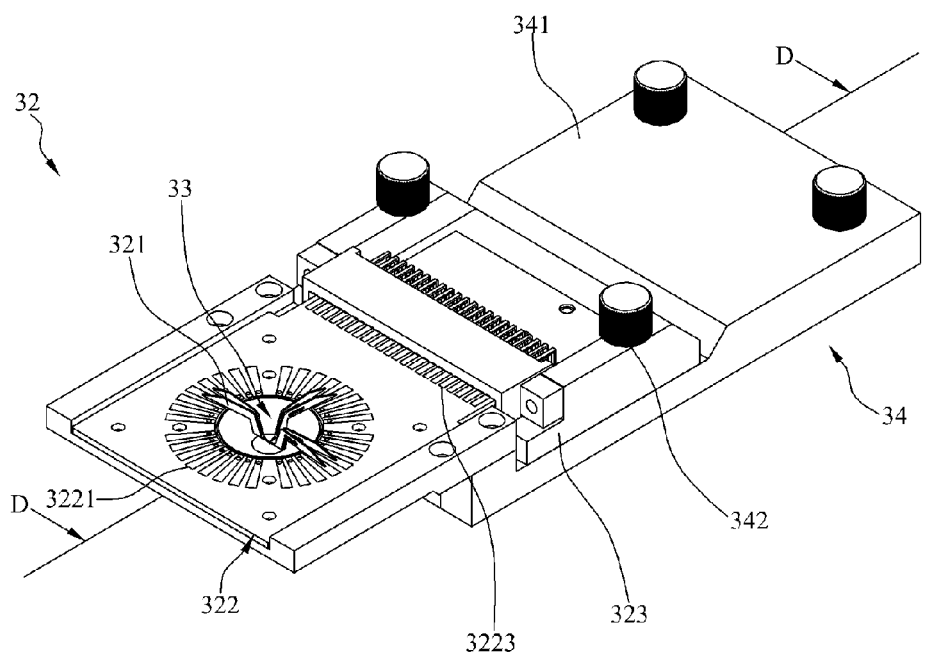
FIG. 8 is a schematic perspective view illustrating coupling of a contact unit, a movement unit and a first conveyance member.
Figure 9:
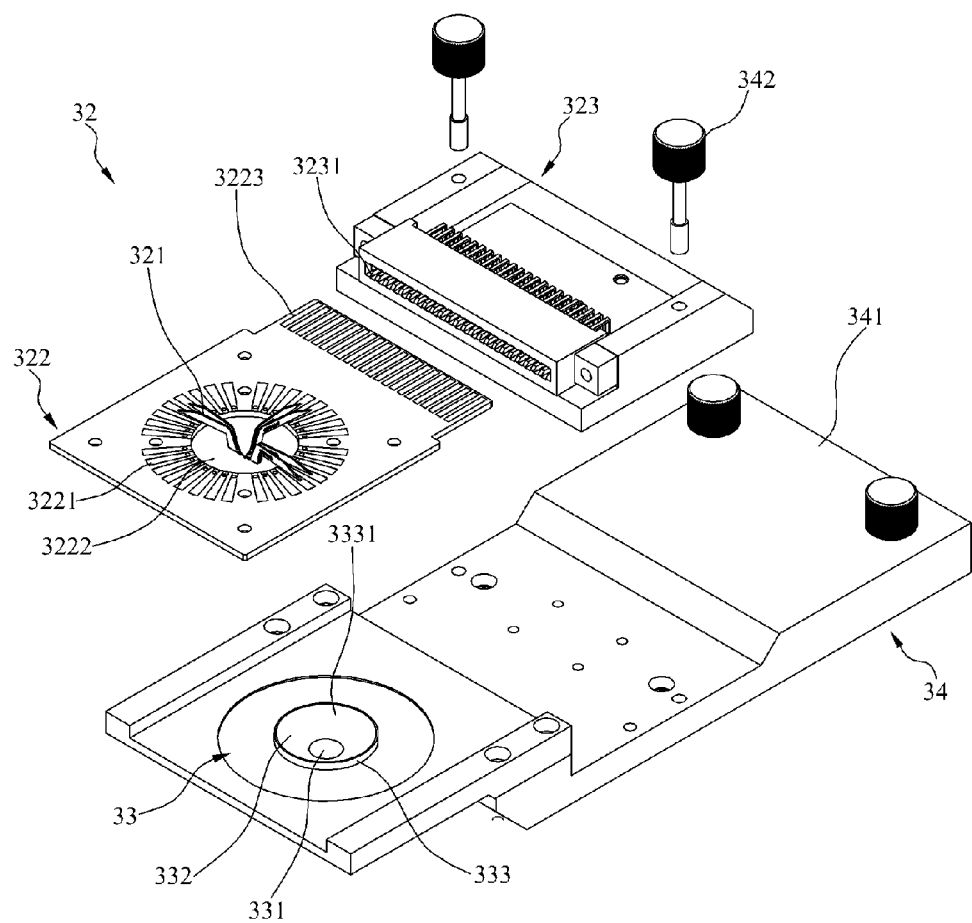
FIG. 9 is an exploded perspective view of FIG. 8.
Figure 10:
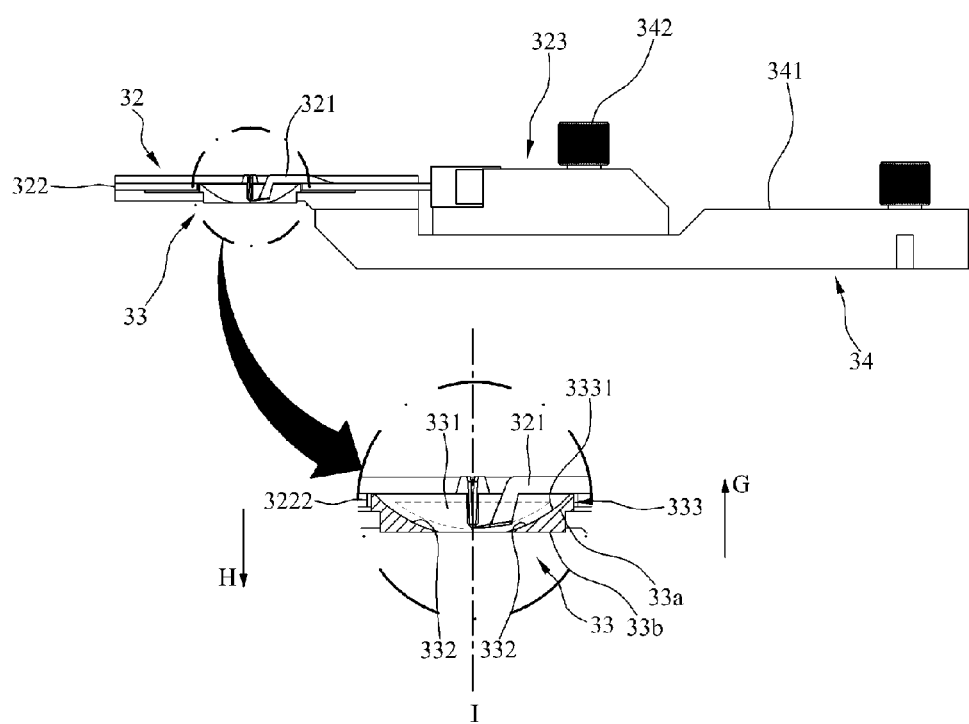
FIG. 10 is a D-D cross sectional view of FIG. 8.

Referring to FIG. 1, the LED chip testing device 1 includes the feeder 2 and the tester 3. The tester 3 includes the measurement unit 31, the contact unit 32, the first conveyance member 33 (shown in FIG. 8), the contact movement member 34 and the main body 35.

Feeder

Figure 2:
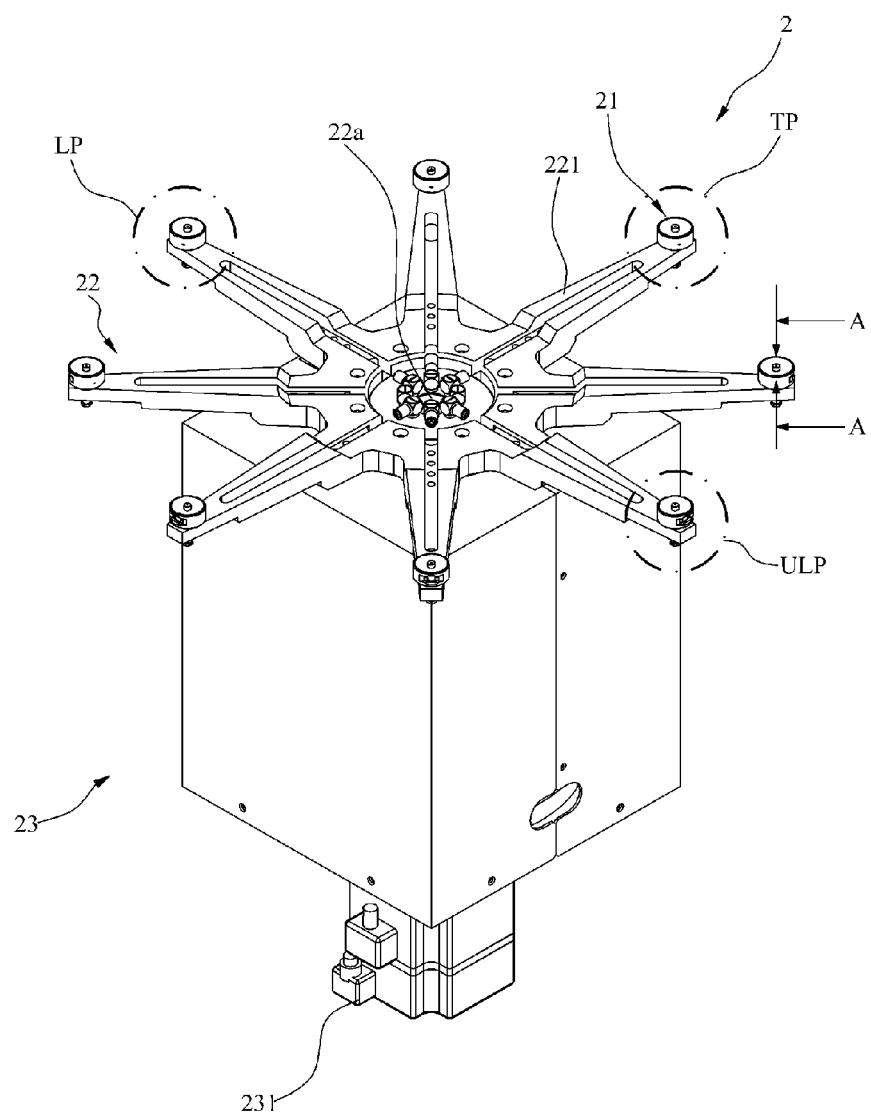
FIG. 2 is a schematic perspective view of a feeder.

Referring to FIGS. 1 and 2, the feeder feeds a to-be-tested LED chip to a testing position where the measurement unit 31 is capable of measuring an optical characteristic of the LED chip. The feeder 2 may include one or more mounting members 21, a rotation member 22 and a rotation unit 23.

Figure 3:
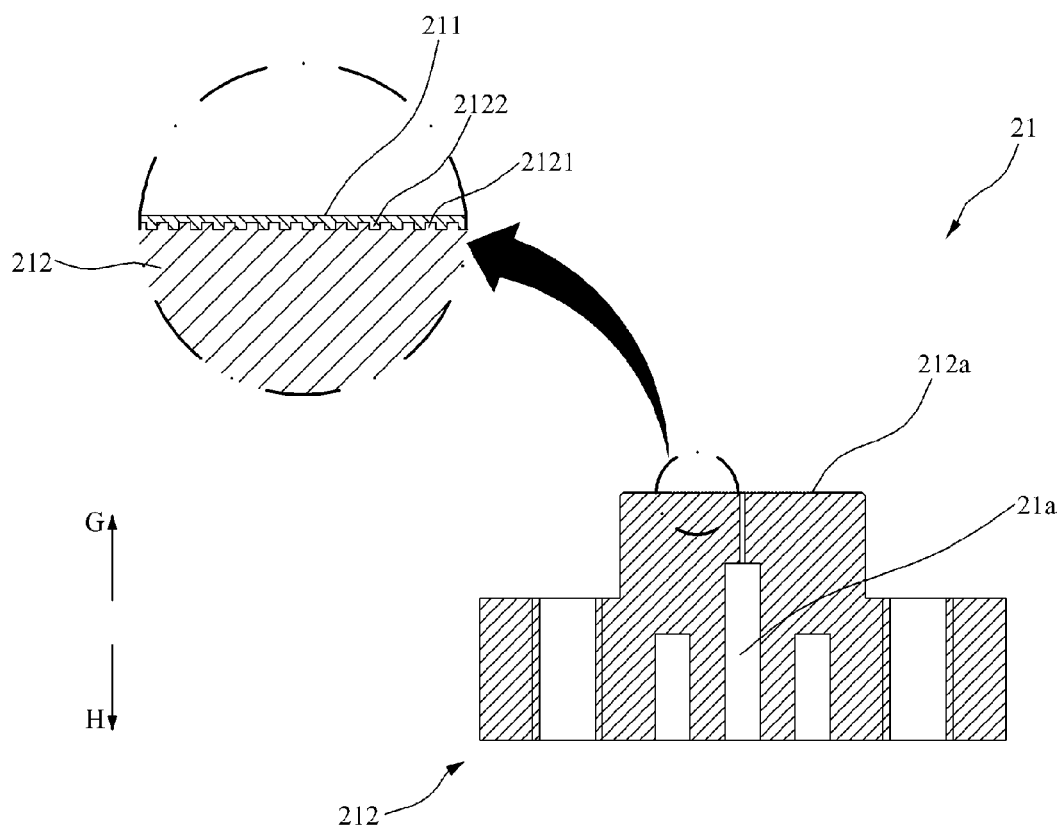
FIG. 3 is an A-A cross sectional view of FIG. 2, showing a mounting member.
Figure 4:
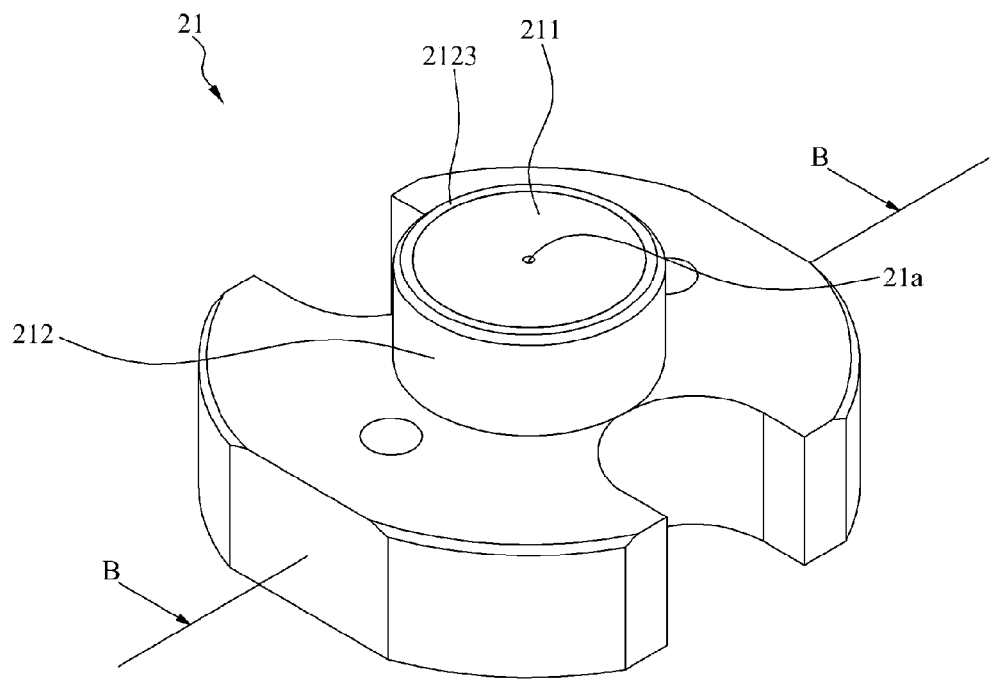
FIG. 4 is a schematic perspective view of a mounting member in accordance with a modification example of the embodiment of the present invention.
Figure 5:
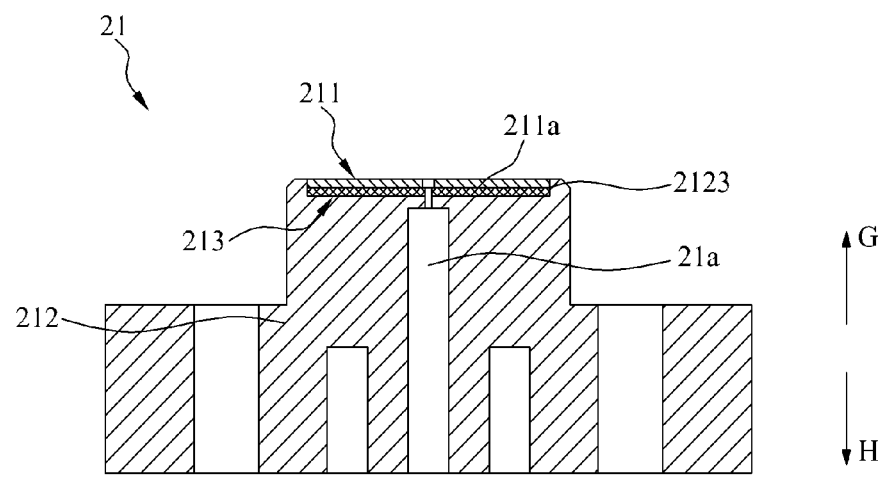
FIG. 5 is a B-B cross sectional view of FIG. 4.

Referring to FIGS. 1 to 3, an LED chip is mounted on the mounting member 21. After the LED chip is mounted on the mounting table, the LED chip is attracted onto the mounting member 21 to be firmly held thereon by an air suctioning device F (shown in FIG. 11). The air suctioning device F may be installed at the rotation member 22. The air suctioning device F is capable of attracting the LED chip mounted on the mounting table 21 by sucking air through a through hole 21a provided in the mounting member 21. The mounting member 21 may be formed in a cylindrical shape.

A plurality of such mounting members 21 may be installed at the rotation member 22. As the rotation unit 23 rotates the rotation member 22, the mounting members 21 can be sequentially located at a testing position TP. When each mounting member 21 is located at the testing position TP, the mounting member 21 is positioned below the measurement unit 31.

The mounting member 21 serves to attract and hold the LED chip thereon. Since a number of LED chips are mounted on the mounting member 21 consecutively, the mounting member 21 may be made of or coated with a material having a high hardness. Desirably, the mounting member 21 may be made of or coated with a material having a high reflectivity so as to allow light emitted from the LED chip to be sent to the measurement unit 31 when the light is sent or reflected toward the mounting member 21, thus preventing a generation of an optical loss.

It may be especially desirable that the mounting member 21 be made of or coated with a material having a constantly high reflectivity within a measurement wavelength band or a wavelength band close thereto, i.e., within a wavelength band of about 200 nm to about 1000 nm. That is to say, when light is sent to a mounting member 21's top surface region other than where the LED chip is placed and a mounting member 21's lateral surface region, the optical characteristic of the LED chip would not be measured accurately if the light is absorbed by the mounting member 21 in a large amount. Desirably, in this regard, the mounting member 21 may be made of a material having a high reflectivity within the measurement wavelength band or the wavelength band close thereto. Furthermore, the optical characteristic of the LED chip may be measured accurately when plurality of mounting members 21 have different reflectivity or when the reflectivity of each mounting member 21 changes from its initial state as the mounting member 21 is worn out after used for a long time. Thus, it is desirable to set the reflectivity of the mounting table 21 to be maintained high constantly within the measurement wavelength band and the wavelength band close thereto.

Meanwhile, in case that the LED chip is of a horizontal type, electrodes are formed only on a top surface of the LED chip during a packaging process. In case that the LED chip is of a vertical type, however, a single electrode is formed on the top surface of the LED chip while a lower part of the LED chip serves as another electrode. It may be desirable to measure the characteristic of the LED chip under the most same condition as the environment after the packaging. Accordingly, electricity needs to be conducted through the lower part of the LED chip in case of the vertical type chip. Thus, the mounting member 21 that comes into contact with the lower part of the vertical type LED chip needs to be made of a highly conductive material so as to reduce electrical resistance when the LED chip emits light.

As stated, in order to measure the optical characteristic of the LED chip stably and with high reliability in consideration of wear resistance, hardness, reflectivity, conductivity, and the like, the entire mounting member 21 or a part of the mounting member 21 may be made of a material containing any one of sapphire, crystal, glass, a ferroalloy, a copper alloy, an aluminum allow, stainless steel, a hard metal, PTEE (polytetrafluoroethylene), gold, platinum and silver. The entire mounting member or a part of the mounting member may be covered with a mirror coating, or plated with gold, platinum or silver.

Meanwhile, the mounting member 21 may include a contact member 211 and a first mounting body 212.

The contact member 211 may be coupled to one side 212a of the first mounting body 212 and brought into contact with the LED chip. The contact member 211 may be made of a highly conductive material. For example, the contact member 211 can be made of, e.g., gold, platinum, or silver. Especially, the contact member 211 can be formed by coating the first mounting body 212 with gold, platinum or silver. The contact member 211 is capable of lowering an electrical resistance of the LED chip when the LED chip is made to emit light by the contact unit 32. Accordingly, the LED chip testing device 1 is capable of measuring the optical characteristic and the electrical characteristic of the LED chip.

The first mounting body 212 is coupled to the rotation member 22. The contact member 211 is coupled to the one side 212a of the first mounting body 212. The first mounting body 212 can be formed in a cylindrical shape.

As stated above, when the contact member 211 is made of a material having a high conductivity and a high reflectivity, it may have a relatively low hardness. In such a case, if the placement of the LED chips on the mounting member 21 is repeated, the contact member 211 may be worn out easily.

To prevent such a problem, the first mounting body 212 may be provided with a plurality of protrusions 2121 projecting in a direction (indicated by an arrow G) facing toward the measurement unit 31 from the LED chip at the testing position TP. The protrusions 2121 may be formed on the one side 212a of the first mounting body 212. By the formation of the protrusions 2121, the one side 212a of the first mounting body 212 can also be provided with a plurality of grooves 2122 depressed in a certain depth in a direction (indicated by an arrow H) facing toward the LED chip placed at the testing position from the measurement unit 31.

The contact member 211 may be coupled to the first mounting body 212 so as to be inserted between the protrusions 2121. That is, the contact member 211 may be formed at the one side 212a of the first mounting body 212 to be inserted in the grooves 2122. Accordingly, the presence of the contact member 211 inserted in the grooves 2122 enables a long-term usage of the mounting member 21 even if LED chips are repetitively placed on the mounting member 21, thus allowing the performance of the LED chips to be measured accurately.

Each of the protrusions 2121 may have a rectangular parallelepiped shape. However, each protrusion 2121 may be formed in another shape other than the rectangular parallelepiped shape, such as a hemispheric shape, as long as the mounting member 211 can be inserted between the protrusions 2121.

The protrusions 2121 can be prepared by forming the grooves 2122 at the one side 212a of the first mounting body 212. A part of the grooves 2122 may be elongated along a first direction, while the other part of the grooves 2122 may be elongated along a second direction perpendicular to the first direction. With this arrangement, the grooves 2122 cross each other, whereby the protrusions 2121 can be formed in a lattice pattern at the one side 212a of the first mounting body 212. The first direction and the second direction may not be perpendicular to each other, but they cross at angles other than the right angles. Furthermore, the grooves 2122 may be formed in three or more different directions.

Referring to FIGS. 1 to 5, a mounting member 21 in accordance with a modification example of the embodiment of the present invention may include a contact member 211 and a first mounting body 212 as described below.

The contact member 211 is coupled to one side 212a of the first contact body 211 and is brought into contact with an LED chip. The contact member 211 may be made of a high-hardness material. For example, the contact member 211 may be made of sapphire, crystal, glass, a ferroalloy, a copper alloy, an aluminum alloy, stainless steel, a hard metal, or PTEE (polytetrafluoroethylene). Accordingly, the even if LED chips are repetitively placed on the mounting member 21, the contact member 211 can be prevented from being worn out easily. A coupling groove 2123 into which the contact member 211 is inserted may be formed at the one side 212a of the first mounting body 212. The coupling groove 2123 may be depressed in a certain depth in the direction (indicated by the arrow H) facing toward an LED chip located on the testing position TP from the measurement unit 31.

The coupling groove 2123 may be formed in a circular plate shape, for example. The coupling groove 2123 may be formed in the substantially same shape as that of the contact member 211 so as to allow the contact member 211 to be inserted therein. The coupling groove 2123 may be formed in another shape other than the disk shape, such as a rectangular plate shape or the like. The coupling groove 2123 may be formed in the substantially same size as that of the contact member 211. The contact member 211 can be coupled to the first mounting body 212 by being insertion-fitted into the coupling groove 2123. The contact member 211 can also be adhered to the first mounting body 212 by an adhesive or the like.

As stated above, in case that the contact member 211 is made of a material having a high hardness, the material may have a low reflectivity. For example, in case that the contact member is made sapphire, crystal, glass, a ferroalloy, a copper alloy, an aluminum allow, stainless steel, a hard metal, or PTEE (polytetrafluoroethylene), some of the light emitted from an LED chip may not reach the measurement unit 31.

To prevent such a problem, the mounting member 21 may further include a reflective member 213. The reflective member 213 may be inserted in the coupling groove 2123 to be located between the contact member 211 and the first mounting body 212. The reflective member 213 reflects the light emitted from the LED chip so as to allow the light to reach the measurement unit 31. Light emitted downward from the LED chip is reflected by the reflective member 213 and thus can be sent to the measurement unit 31. The reflective member 213 may be made of a material having a high reflectivity. For example, the reflective member 213 can be formed by mirror-coating a metal or a resin material. With this configuration, a greater amount of light can be allowed to reach the measurement unit 31, thus allowing the LED chip testing device 1 to inspect the performance of the LED chips more accurately.

The reflective member 213 can be prepared by mirror-coating the contact member 211's one side 211a to be brought into contact with the coupling groove 2123. For example, the contact member 211 may be made of sapphire, and by mirror-coating the one side 211a of the contact member 211 to be brought into contact with the coupling groove 2123, the light emitted from the LED chip can be sent to the measurement unit 31. In such a case, even when the reflectivity of the sapphire-made contact member 211 is deteriorated as its surface is damaged due to a repeated usage of the contact member 211, a high level of reflectivity can be maintained constantly even with a lapse of time because the rear surface of the sapphire is mirror-coated.

The through hole 21a provided in the mounting member 21 may be formed through the contact member 211, the first mounting body 212 and the reflective member 213. The air suctioning device F (shown in FIG. 11) is capable of attracting the LED chip mounted on the mounting member 21 by suctioning air through the through hole 21a.

Referring to FIGS. 1 to 6, a mounting member 21 in accordance with still another modification example of the embodiment of the present invention may further include a second mounting body 214.

The second mounting body 214 includes a through hole through which the first mounting body 212's portion on which an LED chip is to be mounted is inserted. The second mounting body 214 may be coupled to the first mounting body 212 such that the first mounting body 212's portion on which the LED chip is to be mounted is inserted through the through hole of the second mounting body 214.

Figure 6:
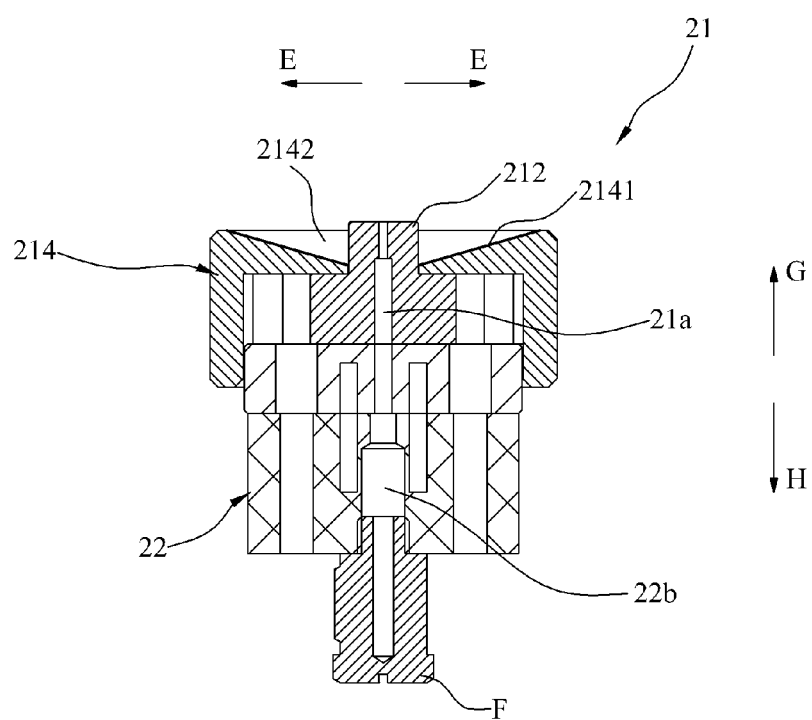
FIG. 6 is a schematic cross sectional view of a mounting member in accordance with another modification example of the embodiment of the present invention.
Figure 7:
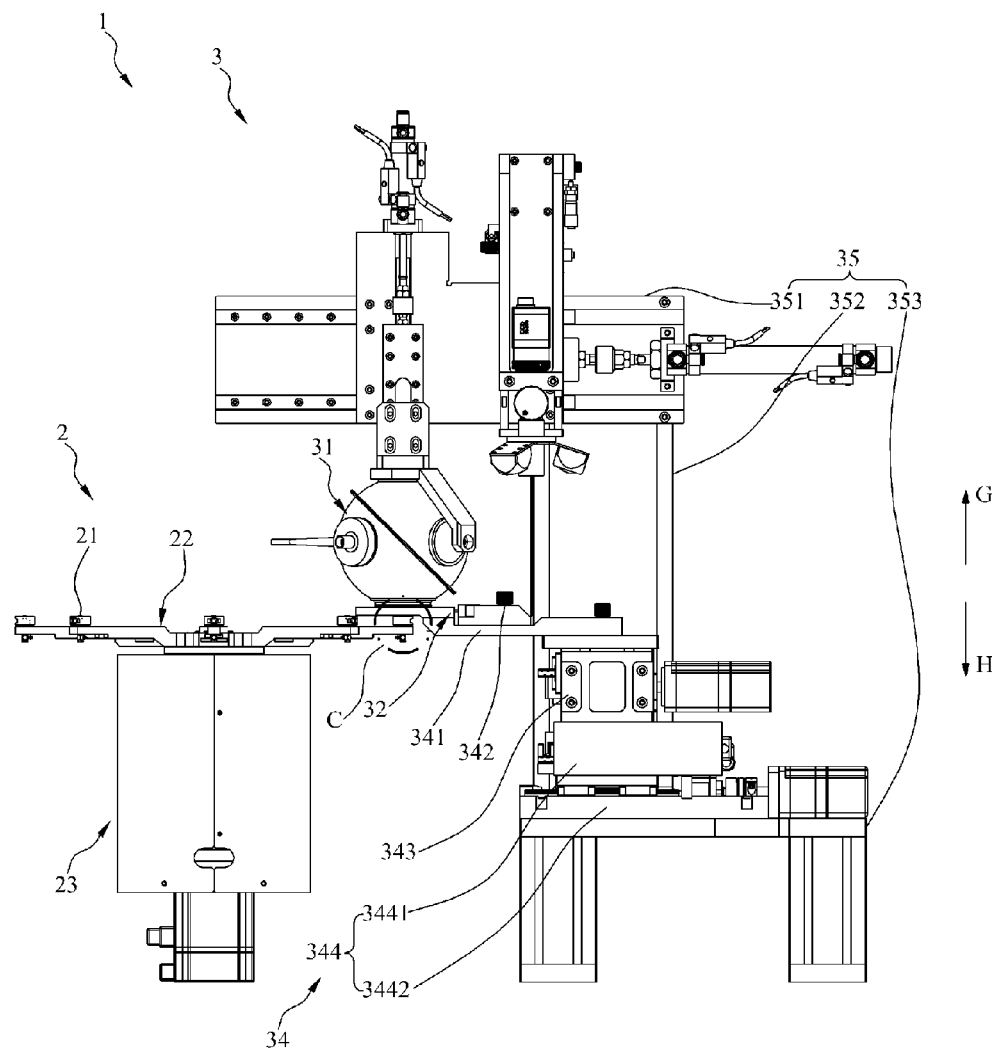
FIG. 7 is a schematic front view of the LED chip testing device in accordance with the present invention.

A top surface of the second mounting body 214 and a top surface of the first mounting body 212 may be located at different heights. As illustrated in FIG. 6, the first mounting body 212 may be formed such that its top surface protrudes higher than the top surface of the second mounting body 214. Though not shown, the second mounting body 214 may be formed such that its top surface protrudes higher than the top surface of the first mounting member 212. The second mounting body 214 may be formed in a cylindrical shape.

The second mounting body 214 is provided with an inclined surface 2141 that serves to send light, which is emitted downward from the LED chip, toward the measurement unit 31. In such a case, the measurement unit 31 may be located above the LED chip placed at the testing position TP.

The inclined surface 2141 may be prepared by forming an inclined groove 2142 which is depressed from the top surface of the second mounting body 214 in a certain thickness. The inclined groove 2142 may be formed so as to be narrowed from the top surface of the second mounting body 214 along a downward direction (indicated by the arrow H). Accordingly, the inclined surface 2141 may be inclined in an outward direction (indicated by an arrow E). The second mounting body 214 may be formed in a cylindrical shape, and the inclined groove 2142 may be formed such that its diameter gradually decreases as it goes downward from the top surface of the second mounting body 214.

Since the presence of the inclined surface 2141 allows a greater amount of light to reach the measurement unit 31, the LED chip testing device 1 in accordance with the embodiment of the present invention can inspect the performance of the LED chip more accurately. The inclined surface 2141 may be made of or coated with a material having a high reflectivity. For example, the inclined surface 2141 may be prepared by polishing a surface of a metal or a metal allow, or it may be prepared by mirror-coating a metal, a resin material, or the like.

Referring to FIGS. 1 and 2, the rotation member 22 is installed next to the main body 35.

A plurality of mounting members 21 may be installed at the rotation member 22. The rotation member 22 can be rotated by the rotation unit. As the rotation member 22 is rotated, the mounting members 21 and to-be-tested LED chips loaded on the mounting member 21 can be sequentially located at the testing position TP.

To be more specific, the plurality of mounting members 22 may be arranged at the rotation member 22 while they are spaced from each other at the same angular interval with respect to a rotational axis 22a. With this arrangement, the rotation unit 23 repeats the rotation and stop of the rotation unit 23 at the same angle, the mounting members 21 can be located at the testing position TP sequentially.

For example, 8 mounting members 21 may be installed at the rotation member 22 while spaced apart from each other at an angular interval of about 45° with respect to the rotational axis 22a. In such a case, as the rotation unit 23 rotates the rotation member 22 by about 45° and stops the rotation of the rotation member 22 repetitively, the mounting members 21 can be located at the testing position TP sequentially. Alternatively, 12 mounting members 21 may be installed at the rotation member 22 at an angular interval of about 30° with respect to the rotational axis 22a. In such a case, as the rotation unit 22 rotates the rotation member 22 by about 30° and stops the rotation of the rotation member 22 repetitively, the mounting members 21 can be located at the testing position TP sequentially.

That is, when the number of the mounting members 21 installed at the rotation member 22 is defined as N (N is an integer larger than 1), N number of mounting members 21 can be installed while they are spaced from each other at an angular interval of (360/N)° with respect to the rotational axis 22a. As the rotation unit 23 rotations the rotation member 22 by (360/N)° and then stops the rotation repetitively, the mounting members 21 can be placed at the testing position TP sequentially. Desirably, an even number of mounting members 22 may be installed at the rotation member 22.

When any one of the mounting members 21 is located at the testing position TP, another mounting member 21 may be located at a loading position LP where an LED chip to be tested is loaded, while the other one of the mounting members 21 may be located at an unloading position ULP where a tested LED chip is unloaded.

An LED chip is loaded on the mounting member 21 located at the loading position LP and is tested after it is moved to the testing position TP. Then, after the testing is completed, the LED chip is moved to the unloading position to be unloaded from the mounting member 21. That is, the feeder 2 is capable of feeding to-be-tested LED chips to the testing position TP and sending tested LED chips to the unloading position ULP. The process of loading an to-be-tested LED chip onto the mounting member 21 located at the loading position LP and the process of unloading a tested LED chip from the mounting member 21 located at the unloading position ULP may be carried out by a transfer means configured to transfer the LED chips, though not shown.

The mounting members 21 may be installed at the rotation member 22 such that at least one mounting member 22 is located at each of the testing position TP, the loading position LP and the unloading position ULP at the same time.

The rotation member 22 may include supporting frames 221 on which the respective mounting members 21 are installed. The rotation member 22 may include the same number of supporting frames 221 as that of the mounting members 21. For example, in case that 8 mounting members 21 are provided at the rotation member 22, the rotation member 22 may include 8 supporting frames 221. In such a case, the supporting frames 221 may be spaced apart from each other at an interval of about 45° with respect to the rotational axis 22a. The supporting frames 221 may be installed such that they are elongated outward from the rotational axis 22a so as to be located at the testing position TP, the loading position LP and the unloading position ULP.

The mounting members 21 may be installed on top surfaces of the supporting frames 221. The air suctioning device F (shown in FIG. 11) may be installed at a bottom surface of each supporting frame 221. A through hole 22b (shown in FIG. 11) communicating with the through hole 21a (shown in FIG. 11) of the mounting member 21 may be provided in the supporting frame 221's portion where the mounting member 21 is installed. The through holes 21a and 22b may be formed in cylindrical shapes, for example.

Referring to FIGS. 1 and 2, the rotation unit 23 rotates the rotation member 22 so as to locate the mounting members 21 at the testing position TP sequentially. The rotation unit 23 may be coupled to a bottom surface of the rotation member 22 and serves to rotate the rotation member 22 about the rotational axis 22a.

The rotation unit 23 may include a motor 231. The motor 231 is configured to rotate the rotation member 22 by being directly coupled to the rotational axis 22a or by being coupled to a non-illustrate shaft connected with the rotational axis 22a. In case that the motor 231 is installed at a position spaced apart from the non-illustrated shaft at a certain distance, the rotation unit 23 may further include a pulley and a belt that connect the motor 231 and the non-illustrated shaft.

Tester

Referring to FIGS. 1 to 7, the tester 3 is installed next to the rotation member 21 and is capable of testing an LED chip located at the testing position TP. As mentioned above, the tester 3 may include the measurement unit 31, the contact unit 32, the first conveyance member 33 (shown in FIG. 8), the contact movement unit 34 and the main body 35.

The measurement unit 31 includes a light receiving hole 311 (shown in FIG. 11) through which light emitted from the LCD chip is introduced. The measurement unit 31 is connected with a testing device (not shown) capable of analyzing a test result upon the LED chip, and is capable of measuring an optical characteristic of the LED chip from the light introduced through the light receiving hole 311 in cooperation with the testing device. The optical characteristic may include brightness, wavelength, luminous flux, illumination, spectral distribution, color temperature, and so forth. An integrating sphere may be used as the measurement unit 31.

The measurement unit 31 may be coupled to the main body 34 such that the light receiving hole 311 is located above the LED chip. At least one of a spectrometer and a photodetector may be installed at the measurement unit 31. For example, the measurement unit 31 may be formed in a spherical shape and the light receiving hole 311 may be formed in a circular shape.

Referring to FIGS. 1 to 10, the contact unit 32 may be connected with the testing device and is capable of making the LED chip emit light in cooperation with the testing device (not shown). The measurement unit 31 is capable of measuring the optical characteristic of the LED chip. Accordingly, the contact unit 32 is capable of testing an electrical characteristic of the LED chip in cooperation with the testing device.

The contact unit 32 may include one or more contact pins 321 and a contact body 322 coupled to the contact movement unit 34. The contact unit 32 can be moved horizontally and can also be moved up and down by the contact movement unit 34. In cooperation with the testing device, the contact unit 32 is capable of making the LED chip in contact with the contact pins 321 emit light. The contact unit 32 may include a plurality of such contact pins 321. A probe card may be used as the contact unit 32.

The contact body 322 may include one or more terminals 3221 electrically connected with the contact pins 321. The contact pins 321 are coupled to the contact body 322 while they are kept in contact with the terminals 3221. The contact pins 321 can be electrically connected with the testing device via the terminals 3221. The contact body 422 may include a plurality of terminals 3221, and the connect pin 321 may be coupled to each of the terminals 3221.

The contact body 322 may be coupled to the contact movement unit 34 so as to be located between the measurement unit 31 and the LED chip in contact with the contact pins 321. The measurement unit 31 may be located above the contact body 322 and the LED chip placed at the testing position TP may be located below the contact body 322.

The contact body 322 may be provided with an insertion hole 3222 through which the contact pin 321 is inserted. One side of the contact pin 321 is connected with the terminal 3221 formed on the top surface of the contact body 322, while the other side of the contact pin 321 is brought into contact with the LED chip located right below the contact main body 322 after inserted through the insertion hole 3222. The light emitted from the LED chip may reach the inside of the measurement unit 31 after passing through the insertion hole 3222 and the light receiving hole 311 (shown in FIG. 11). For example, the contact body 322 may be formed in a quadrilateral plate shape, and the insertion hole 3222 may be formed in a circular shape.

The contact unit 32 may include a connecting unit 323. At least one connecting terminal 3223 is formed at one side of the contact body 322, and the contact body 322 can be electrically connected with the connecting unit 323 via the connecting terminal 3223. The connecting unit 323 may be connected with the testing device (not shown), and the contact pin 321 can be electrically connected with the testing device (not shown) via the contact body 322 and the connecting unit 323.

The connecting unit 323 may include a connecting groove 3231 into which the contact body 322 is inserted. The contact body 322 may include at least one connecting terminal 3223 at its one side inserted into the connecting groove 3231. The connecting unit 323 may be detachably coupled to the contact movement unit 34, and the contact body 322 may be inserted into the connecting unit 323 and located between the measurement unit 31 and the LED chip located at the testing position TP.

Referring to FIGS. 1 to 11, the first conveyance member 33 is installed between the contact unit 32 and the LED chip located at the testing position TP. Accordingly, in the LED chip testing device 1, since a part of a gap between the measurement unit 31 and the LED chip can be blocked by the first conveyance member 33, the amount of light that passes through the gap between the measurement unit 31 and the LED chip after emitted from the LED chip can be reduced as compared to conventional cases.

The first conveyance member 33 may be coupled to the contact movement unit 34. Accordingly, when the contact unit 32 needs to be replaced, only the contact unit 32 can be replaced separately from the first conveyance member 33.

The first conveyance member 33 includes a first passing hole 331 and a first conveyance surface 332.

The first passing hole 331 may be formed through the first conveyance member 33. The contact pin 321 may come into contact with the LED chip located below the first conveyance member 33 after inserted through the first passing hole 331. That is, the contact pin 321 can be brought into contact with the LED chip located at the testing position TP after inserted through the first passing hole 331. The light emitted from the LED chip can reach the inside of the measurement unit 31 after passing through the first passing hole 331 and the light receiving hole 311. Accordingly, the contact pine 321 can be brought into contact with the LED chip without being blocked by the first conveyance member 33, and the light emitted from the LED chip can reach the inside of the measurement unit 31 without being blocked by the first conveyance member 33.

The first passing hole 331 of the first conveyance member 33 may be formed such that its size is gradually reduced in a direction (indicated by the arrow H) facing toward the LED chip located at the testing position TP from the measurement unit 31. That is, the first passing hole 331 may be formed such that its diameter is gradually reduced in a downward direction (indicated by the arrow H) from a top surface 33a of the first conveyance member 33. The first passing hole 331 may be formed such that its diameter gradually decreases in the downward direction (indicated by the arrow H) from the top surface 33a of the first conveyance member 33, and it may be have a hemispherical shape.

The first conveyance surface 332 conveys the light emitted from the LED chip toward the measurement unit 31 so as to allow the light to reach the inside of the measurement unit 31 through the light receiving hole 311. Light emitted from the LED chip in a lateral direction can be conveyed to the measurement unit 31 by the presence of the first conveyance surface 332. With this configuration, since a greater amount of light can reach the inside of the measurement unit 31, the LED chip testing device 1 is capable of inspecting performance of the LED chip more accurately. The first conveyance surface 332 may be made of or coated with a material having a high reflectivity. To elaborate, the first conveyance surface 332 may be prepared by polishing a surface of a metal or a metal alloy, or may be prepared by mirror-coating a metal, a resin material or the like.

The first conveyance surface 332 may be formed along an outer surface of the first passing hole 331 so as to convey the light emitted from the LED chip toward the measurement unit 31. That is, as illustrated in an enlarged view of FIG. 10, the first conveyance surface 332 may be formed such that it is distanced away from a center I of the first passing hole 332 as it goes in an upward direction (indicated by an arrow G) from a bottom surface 33b of the first conveyance member 331. In case that the first passing hole 331 is formed in the hemispherical shape, the first conveyance surface 332 may be formed in a curved surface shape.

The first conveyance member 33 may further include a first protruding member 333.

The first protruding member 333 may be formed such that it protrudes in the direction (indicated by the arrow G) facing toward the measurement unit 31 from the LED chip located at the testing position TP. That is, the first protruding member 333 may be formed so as to project in the upward direction (indicated by the arrow G) from the top surface 33a of the first conveyance member 33. The first protruding member 333 may be inserted into the insertion hole 3222.

The first protruding member 333 may be provided with a first inclined surface 3331 extended from the first conveyance surface 332. The first conveyance surface 332 and the first inclined surface 3331 may be formed at the same inclination. That is, the first conveyance surface 332 and the first inclined surface 3331 may be formed such that they form a single curved surface. With this configuration, the first conveyance surface 332 and the first inclined surface 3331 are capable of conveying the light emitted from the LED chip toward the measurement unit 31.

Accordingly, since the first conveyance member 33's area for conveying the light emitted from the LED chip toward increases, a greater amount of light can reach the inside of the measurement unit 31, so that the LED chip testing device 1 is capable of inspecting the performance of the LED chip more accurately. The first inclined surface 3331 may be made of or coated with a material having a high reflectivity. For example, the first inclined surface 3331 may be prepared by polishing a metal or a metal alloy, or may be prepared by mirror-coating a metal, a resin material, or the like.

Referring to FIGS. 1 to 12, the contact movement unit 34 may include a contact supporting mechanism 341, a contact coupling mechanism 342 and a contact elevating mechanism 343.

The contact supporting mechanism 341 sustains the contact unit 32. The contact unit 32 may be detachably coupled to the contact supporting mechanism 341 via the contact coupling mechanism 342. The first conveyance member 33 is coupled to the contact supporting mechanism 341 so as be located below the contact unit 32. Accordingly, when the contact unit 32 needs to be replaced due to a change of the kind of the LCD chip or a damage of the contact pin 321, only the contact unit 32 can be replaced independently of the first conveyance member 33.

At least one of the contact body 322 and the connecting unit 323 may be coupled to the contact supporting mechanism 341. The contact supporting mechanism 341 is provided with a through hole into which the first conveyance member 33 is inserted. The first conveyance member 33 may be coupled to the contact supporting mechanism 341 by an insertion fitting mechanism by being inserted into the through hole. The first conveyance member 33 may be coupled to the contact supporting mechanism 341 by a fastening member such as bolts after inserted into the through hole.

The contact supporting mechanism 341 may be coupled to the contact elevating mechanism 343. As the contact supporting mechanism 341 is elevated up and down by the contact elevating mechanism 343, the contact unit 32 and the first conveyance member 33 coupled to the contact supporting mechanism 341 can also be moved up and down. The contact supporting mechanism 341 may be formed in a quadrilateral plate shape elongated in a direction facing toward the measurement unit 31 from the contact elevating mechanism 343.

The contact coupling mechanism 342 allows the contact unit 32 to be detachably coupled to the contact supporting mechanism 341. A fastening member such as bolts may be used as the contact coupling mechanism 342. The contact unit 32 may have a through hole through which the contact coupling mechanism 342 is inserted, and the contact supporting mechanism 341 may have a groove engaged with the contact coupling mechanism 342.

Referring to FIGS. 1 to 12, the contact elevating mechanism 343 is capable of moving the contact unit 32 in a vertical direction (Z direction shown in FIG. 2). The contact elevating mechanism 343 is capable of lowering the contact unit 32 so as to allow the contact pins 321 to be brought into contact with the LED chip. Upon the completion of the testing of the LED chip, the contact elevating mechanism 343 is capable of raising the contact unit 32 while preventing damage of the contact pins 321 and the LED chip due to the contact therebetween.

The contact elevating mechanism 343 is capable of elevating the contact supporting mechanism 341 up and down so as to allow the first conveyance member 33 to be located at a first position or a second position. The contact supporting mechanism 341 is coupled to the first conveyance member 33.

Figure 11:
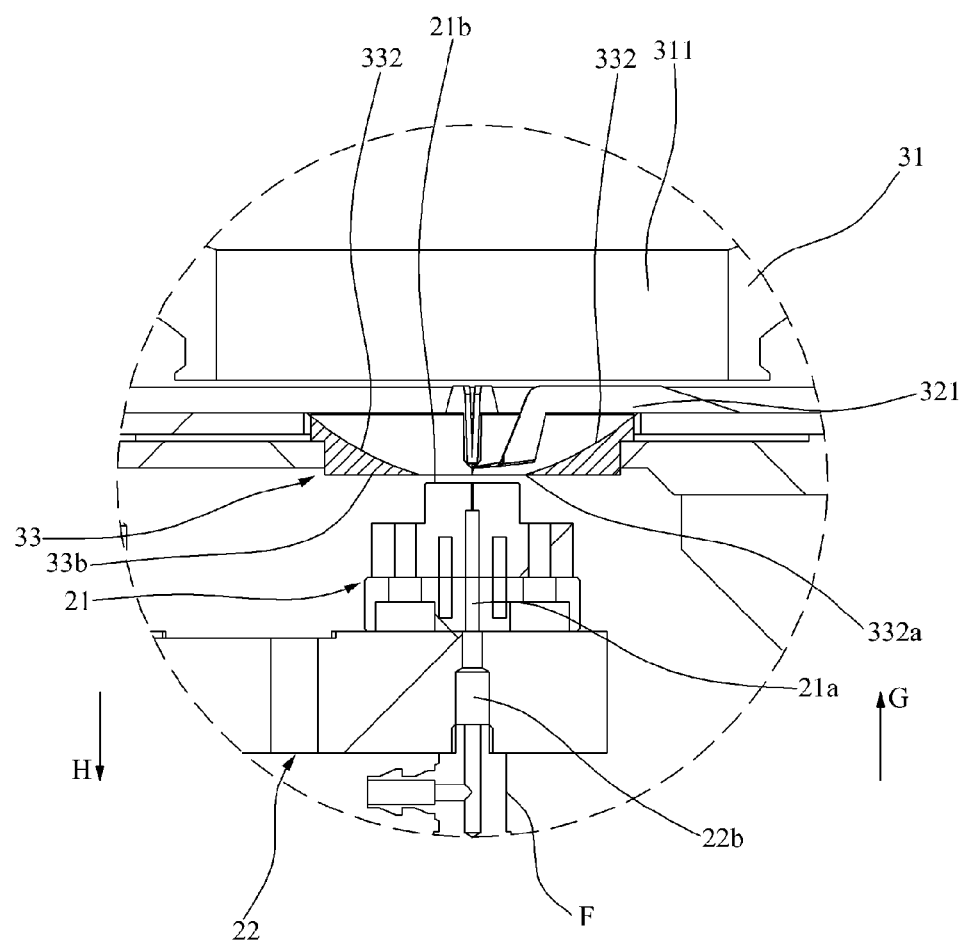
FIGS. 11 and 12 provide enlarged views of a part C of FIG. 7 to illustrate a state of an LED chip which is tested in the LED chip testing device in accordance the present invention.
Figure 12:
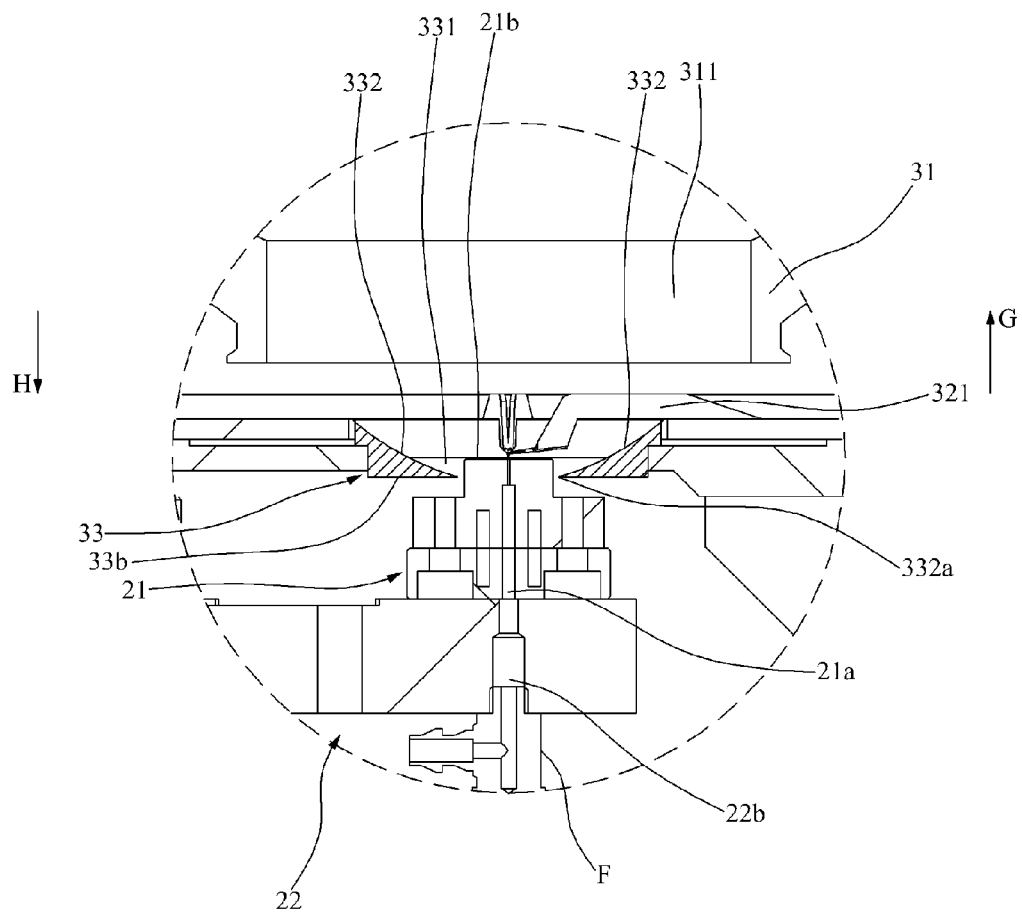

When the first conveyance member 33 is located at the first position, the first conveyance member 33 is positioned above the mounting member 21, as illustrated in FIG. 11. The contact elevating mechanism 343 is capable of raising the contact supporting mechanism 341 so as to locate a lower end 332a of the first conveyance surface 332 above the top surface 21b of the mounting member 21. When the first conveyance member 33 is located at the first position, the contact pins 321 are located at a position spaced apart from the LED chip on the mounting member 21 at a certain distance When the first conveyance member 33 is located at the second position, the first conveyance member 33 is located at a position where the mounting member 21 is inserted into the first passing hole 331, as illustrated in FIG. 12. That is, the bottom surface 33b of the first conveyance member 33 is located below the top surface 21b of the mounting member 21. The contact elevating mechanism 343 is capable of lowering the contact supporting mechanism 341 so as to allow the lower end 332a of the first conveyance surface 332 to be located below the top surface 21b of the mounting member 21. When the first conveyance member 33 is located at the second position, the contact pins 321 come into contact with the LED chip loaded on the mounting member 21, and the contact unit 32 makes the LED chip in contact with the contact pins 321 emit light.

In this configuration, the light emitted from the LED chip in the lateral direction is sent toward the measurement unit 31 by the first conveyance surface 332, a greater amount of light can reach the inside of the measurement unit 31. Accordingly, the LED chip testing device 1 is capable of inspecting the performance of the LED chip more accurately.

If the LED chip is located at the testing position TP, the contact elevating mechanism 343 lowers the contact supporting mechanism 341 so as to allow the first conveyance member 33 to be located at the second position. Upon the completion of the testing of the LED chip, the contact elevating mechanism 343 raises the contact supporting mechanism 341 so as to allow the first conveyance member 33 to be located at the first position. Thereafter, the rotation unit 23 is capable of rotating the rotation member 22.

Accordingly, even when the rotation member 22 is rotated, the mounting member 21 and the LED chip loaded on the mounting member 21 can be prevented from colliding with the first conveyance member 33 and the contact pines 321. If a new LED chip is loaded at the testing position TP, the rotation unit 23 would stop the rotation member 22, and the contact elevating mechanism 343 would lower the contact supporting mechanism 341 so as to allow the first transfer member 33 to be located at the second position.

The contact elevating mechanism 343 is capable of moving the contact unit 32 up and down by using a motor; and a connecting means coupled to each of the motor and the contact unit 32. The connecting means may be a pulley and a belt, a ball screw, a cam member or the like. The contact elevating mechanism 343 may be configured to elevate the contact unit 32 by using a hydraulic cylinder or a pneumatic cylinder.

Here, the LED chip loaded at the testing position TP may not always be mounted on the same position on the mounting member 21. When the LED chip is loaded onto the mounting member 21 at the loading position LP, the LED chip may not be placed at a certain preset position, or a mounting state of the LED chip on the mounting member 21 may be changed as the LED chip is moved by a centrifugal force when it is carried to the testing position TP from the loading position LP. To achieve accurate testing even in such a case, the contact movement unit 34 may further include a contact movement mechanism 344 that moves the contact unit 32 in horizontal directions (X and Y directions shown in FIG. 1).

The contact movement mechanism 344 is capable of moving the contact unit 32 so as to locate the contact pins 321 at a position where they can come into contact with the LED chip. The contact elevating mechanism 34 may be coupled to the contact movement mechanism 344. The contact movement unit 344 is capable of moving the contact unit 32 by moving the contact elevating mechanism 343. The contact supporting mechanism 341 may be coupled to the contact movement mechanism 344, and the contact movement mechanism 344 may be coupled to the contact elevating mechanism 343.

The contact movement mechanism 344 is configured to the contact unit 32 by using a hydraulic cylinder or a pneumatic cylinder. The contact movement mechanism 344 may be configured to move the contact unit 32 by using a motor; and a connecting means coupled to each of the motor and the contact unit 32. The connecting means may be a pulley and a belt, ball screws, a cam member or the like.

The contact movement mechanism 344 may further include a first contact movement unit 3441 configured to move the contact unit 32 in a first horizontal direction (X-axis direction, shown in FIG. 1); and a second contact movement mechanism 3442 configured to move the contact unit 32 in a second horizontal direction (Y-axis direction, shown in FIG. 1).

The contact elevating mechanism 343 may be coupled to the second contact movement mechanism 3442, while the second contact movement mechanism 3442 may be coupled to the first contact movement mechanism 3441. The contact elevating mechanism 343 may be coupled to the first contact movement mechanism 3441, while the first contact elevating mechanism 3441 may be coupled to the second contact mechanism 3442.

Though not shown, the contact movement mechanism 344 is configured to move the contact unit 32 to a position where the contact pins 321 can be brought into contact with the LED chip based on LED chip state information acquired by a sensor unit (not shown) that senses a mounting state of the LED chip on the mounting member 21. The sensor unit (not shown) is capable of checking a mounting position of the LED chip on the mounting member 21. The sensor unit (not shown) may include a CCD camera that is capable of taking an image of the mounting state of the LED chip on the mounting member 21.

Here, LED chips loaded at the loading position may not always be mounted on the mounting member 21 in the same direction. When a LED chip is loaded onto the mounting member 21 at the loading position LP, the LED chip may not be loaded in a certain preset direction, or a mounting state of the LED chip on the mounting member 21 may be changed as the LED chip is rotated by a centrifugal force when it is carried to the testing position TP from the loading position LP.

Figure 13:
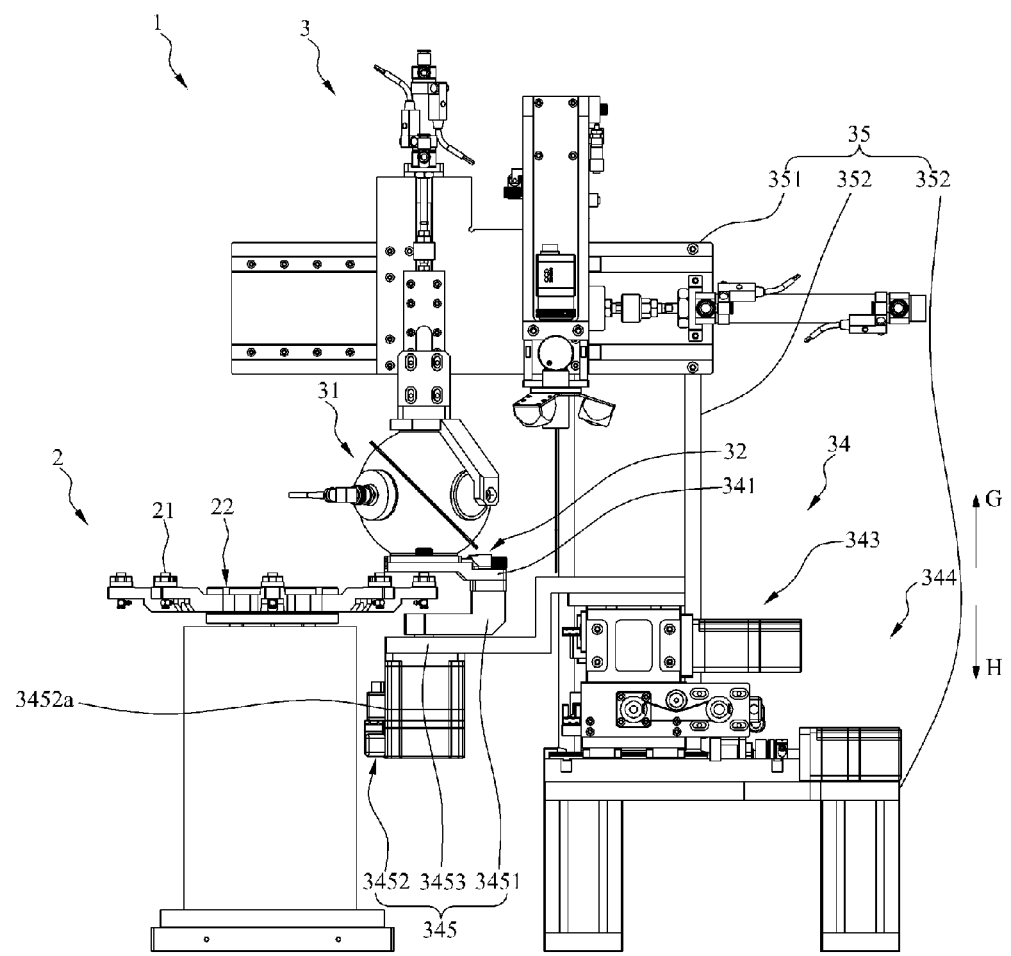
FIG. 13 is a schematic front view of an LED chip testing device in accordance with a modification example of the embodiment of the preset invention.

To achieve accurate testing even in such a case, the contact movement unit 34 may further include a contact rotation mechanism 345 (shown in FIG. 13).

Referring to FIGS. 1 to 14, the contact rotation mechanism 345 is configured to rotate the contact supporting mechanism 341 so as to allow the contact pins 321 to be brought into contact with the LED chip located at the testing position TP. The contact supporting mechanism 341 may be coupled to the contact rotation mechanism 345. As the contact rotation mechanism 345 rotates the contact supporting mechanism 341, the contact unit 32 coupled to the contact supporting mechanism 341 can be rotated.

With this configuration, since the contact pins 321 are allowed to come into precise contact with the LED chip located at the testing position TP as the contact unit 32 is rotated based on the mounting state of the LED chip on the mounting member 21 at the testing position TP, the LED chip testing device 1 is capable of inspecting the performance of the LED chip more accurately.

The contact rotation mechanism 345 may include a contact rotation member 3451, a contact driving mechanism 3452 and a contact coupling mechanism 3453.

The contact supporting mechanism 341 is coupled to the contact rotation member 3451. The contact rotation member 3451 may be rotatably coupled to the contact coupling mechanism 3453 and may be configured to be rotated about a contact rotational axis 3451a by the contact driving mechanism 3452. As the contact rotation member 3451 rotates, the contact supporting mechanism 341 can be rotated, and, accordingly, the contact unit 32 coupled to the contact supporting mechanism 341 can be rotated.

The contact driving mechanism 3452 is capable of rotating the contact rotation member 3451 about the contact rotation axis 3451a. The contact driving mechanism 3452 is capable of rotating the contact rotation member 3451 so as to allow the contact pins 321 to be brought into contact with the LED chip located at the testing position TP. The contact driving mechanism 3452 is capable of rotating the contact rotation member 3451 about the contact rotational axis 3451a in a clockwise or counterclockwise direction.

The contact driving mechanism 3452 may include a motor 3452a. The motor 3452a may be configured to drive the contact rotation member 3452 by being directly coupled to the contact rotational axis 3451a to drive the contact rotation member 3452, or it may be configured to drive the rotation member 22 by being coupled to a shaft (not shown) connected with the contact rotational member 3451a. In case that the motor 3452a is installed at a position spaced apart from the non-illustrated shaft at a certain distance, the contact driving mechanism 3452 may further include a pulley and a belt that connect the motor 3452a and the non-illustrated shaft.

Connected to the contact coupling mechanism 3453 are the contact rotation member 3451 and the contact driving mechanism 3452. The contact rotation member 3451 may be coupled to a top surface of the contact coupling mechanism 3453, while the contact driving mechanism 3452 may be coupled to a bottom surface of the contact coupling mechanism 3453.

The contact coupling mechanism 3453 may be coupled to the contact elevating mechanism 343, and the contact elevating mechanism 343 may be coupled to the contact movement mechanism 344. In this configuration, the contact coupling mechanism 3453 can be moved up and down by the contact elevating mechanism 343 and can be moved in the first horizontal direction (X-axis direction, shown in FIG. 1) and in the second horizontal direction (Y-axis direction, shown in FIG. 1) by the contact movement mechanism 344. The contact coupling mechanism 3453 may be coupled to the contact movement mechanism 344, and the contact movement mechanism 344 may be coupled to the contact elevating mechanism 343.

Here, the contact rotation mechanism 345 can be implemented in two different ways depending on a position of the contact rotational axis 3451a. Below, the two examples may be described in sequence with reference to the accompanying drawings.

Figure 14:
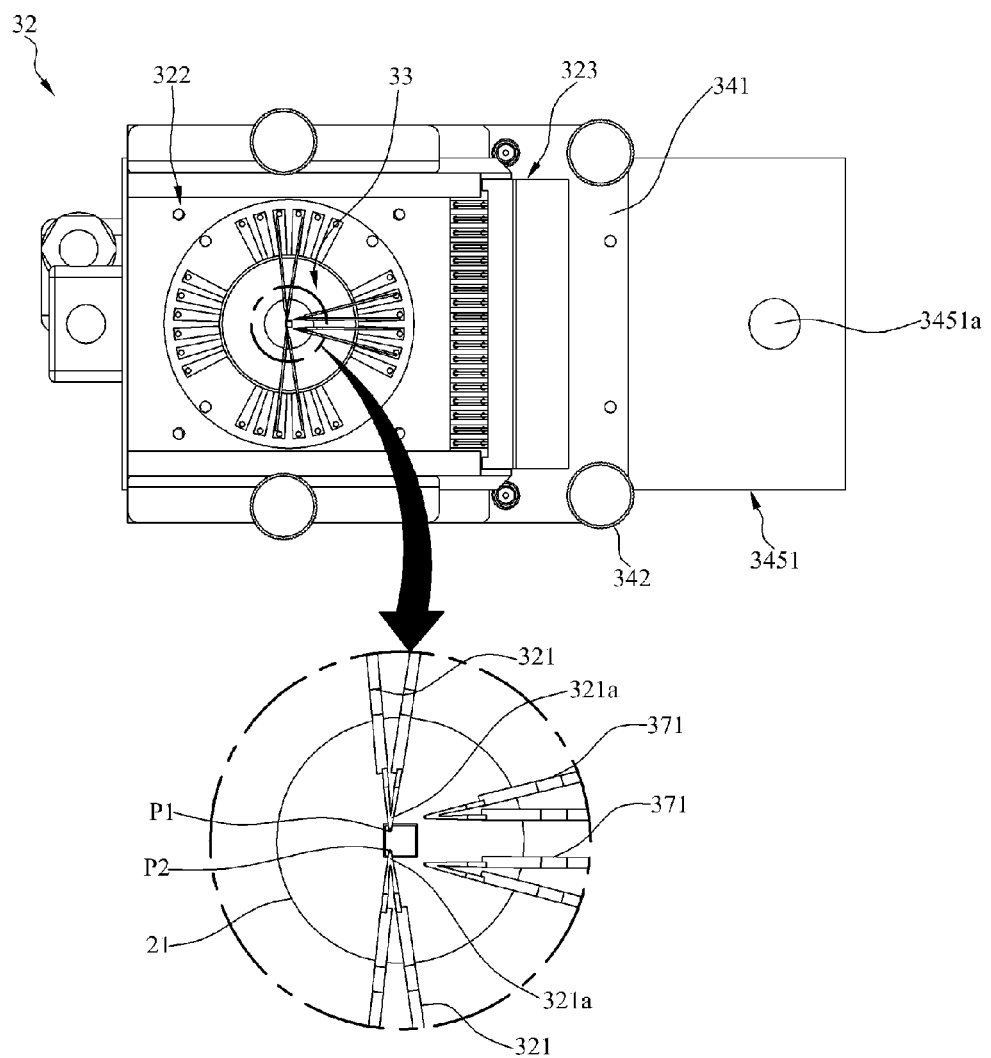
FIGS. 14 to 17 illustrate operational statuses for describing a process of testing the LED chip.

As illustrate in an enlarged view of FIG. 14, an LED chip may include two pads P1 and P2, and the LED chip is tested while each of the pads P1 and P2 is in contact with the contact pin 321. If the LED chip is placed at the testing position TP while it is loaded on the mounting member 21 at a position and in a direction illustrated in the enlarged view of FIG. 14, the contact pins 321 are allowed to come into contact with the pads P1 and P2 without having to move or rotate the contact unit 32 in a horizontal direction. As mentioned above, however, the mounting state of the LED chip on the mounting member 21 can be varied for various reasons.

To achieve accurate testing of the LED chip in such a case, in the contact rotation mechanism 345 in accordance with a first example, the contact driving mechanism 3452 is configured to rotate the contact rotation member 3451 about the contact rotational axis 3451a spaced at a certain distance away from one end 321a of the contact pin 321 in contact with the LED chip. That is, the contact driving mechanism 3452 is capable of rotating the contact rotation member 3451 about the contact rotational axis 3451a spaced sideway at a certain distance away from the mounting member 21 located at the testing position TP.

Figure 15:
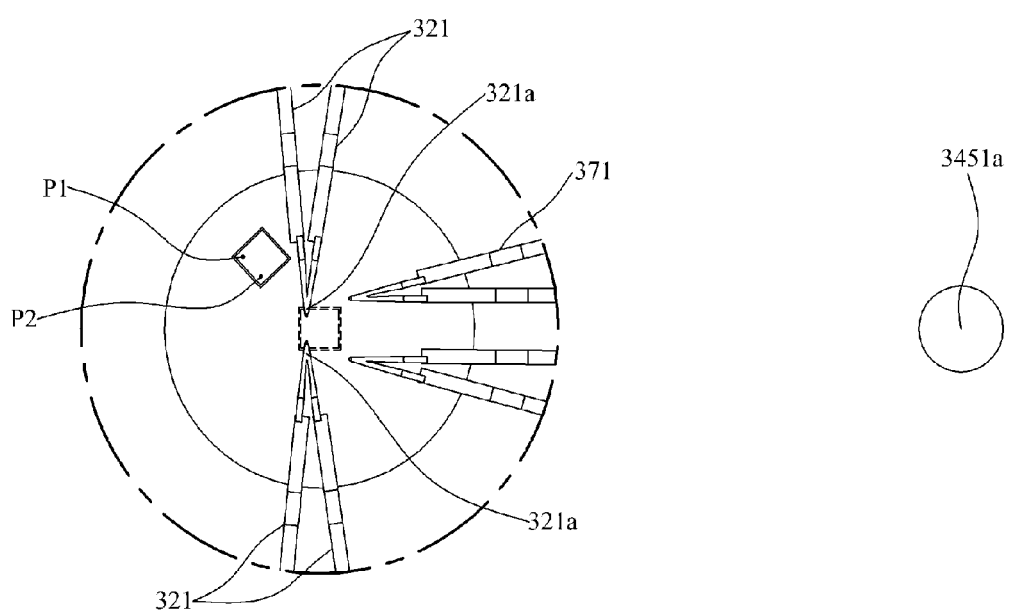
Figure 16:
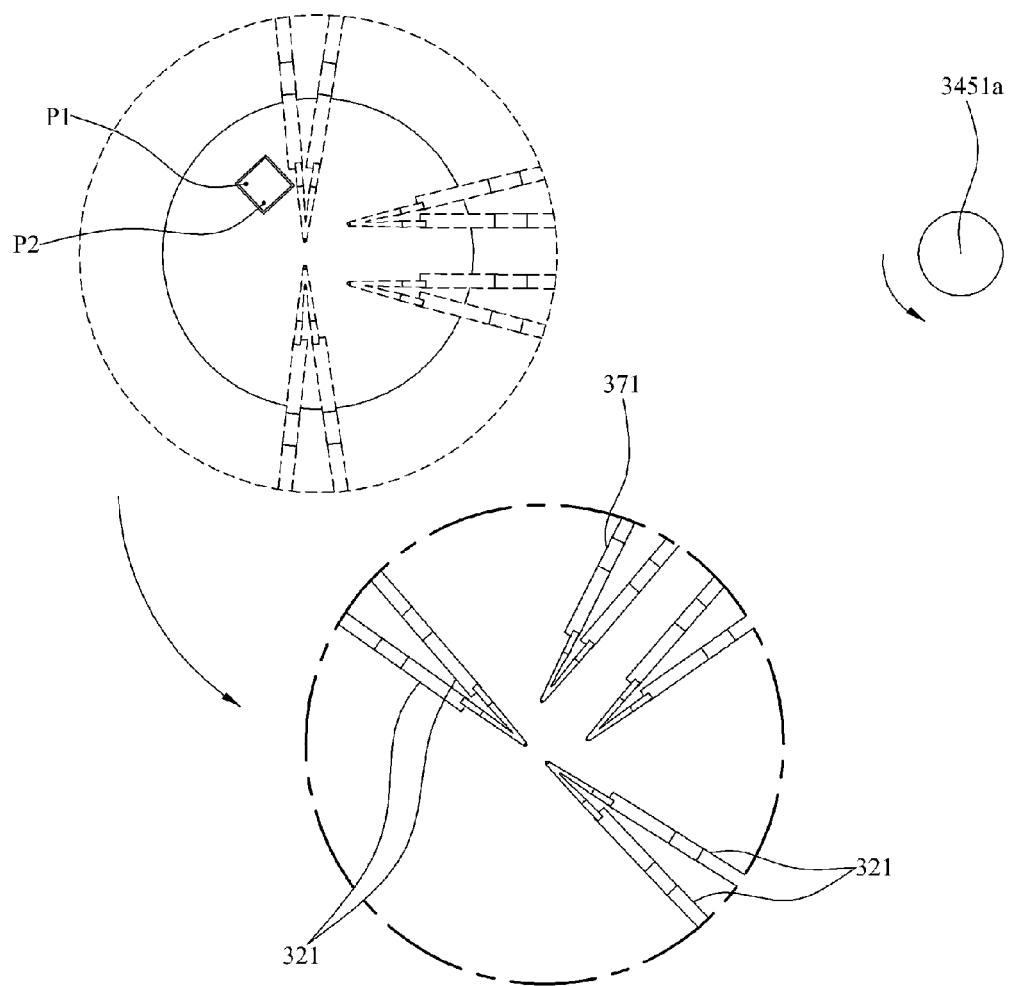
Figure 17:
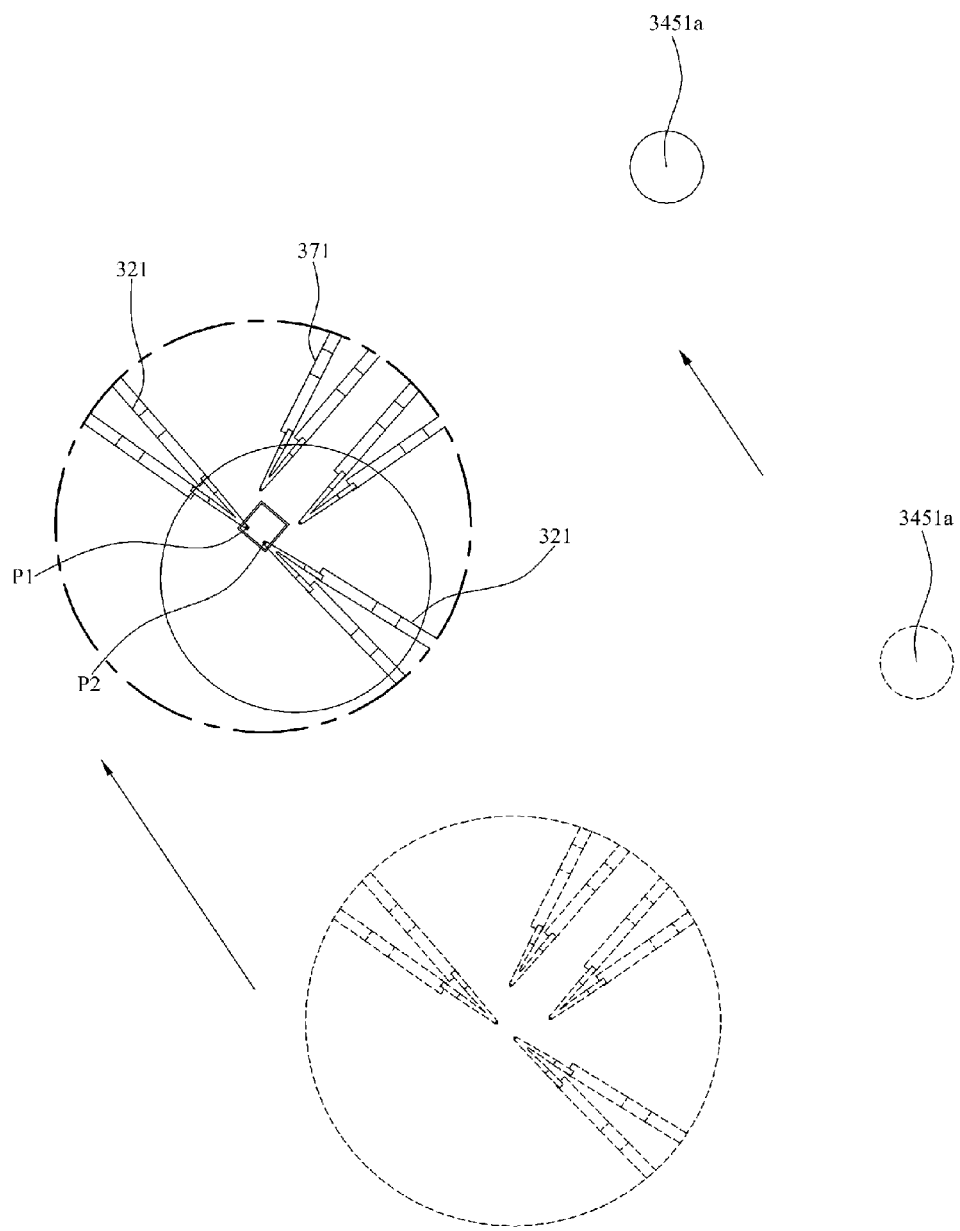
Figure 18:
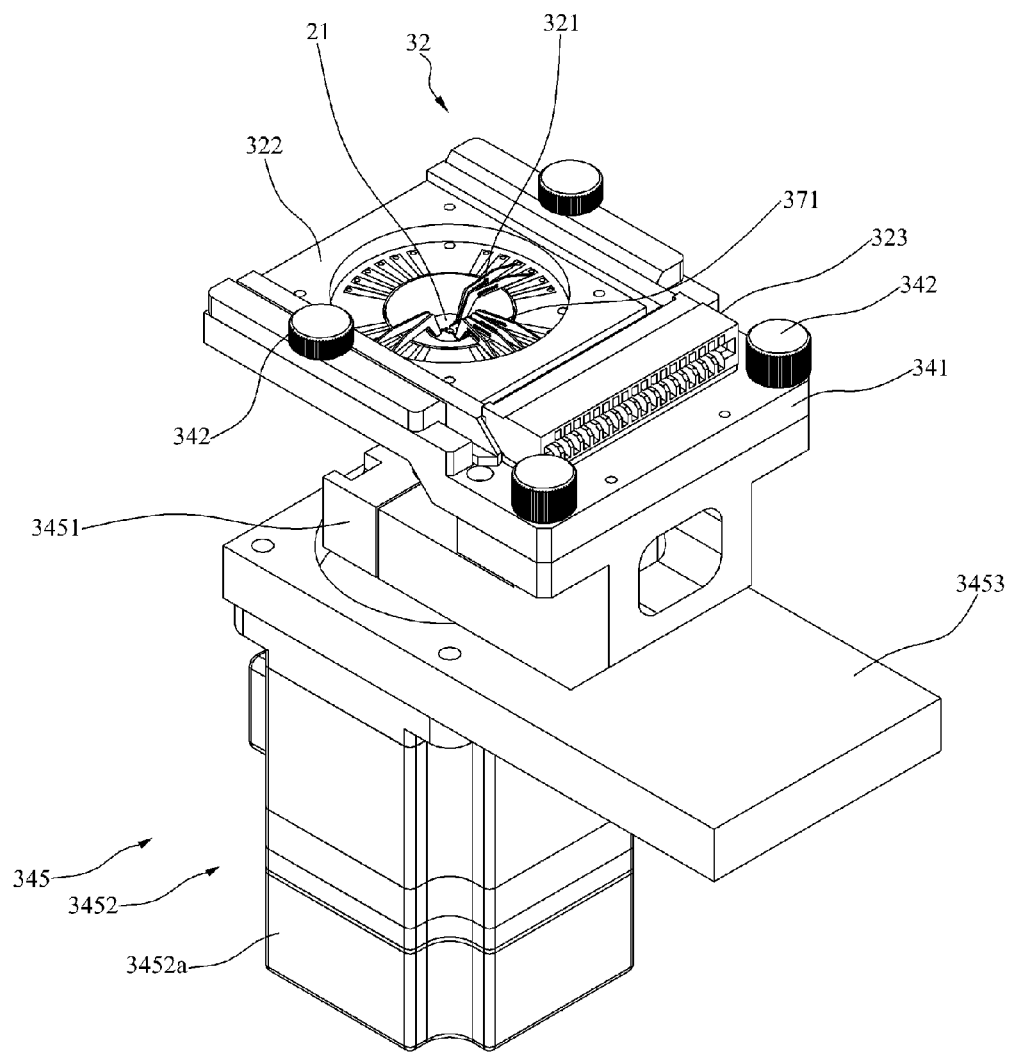
FIG. 18 is a schematic perspective view of a contact movement unit in accordance with a modification example of the embodiment of the present invention.
Figure 19:
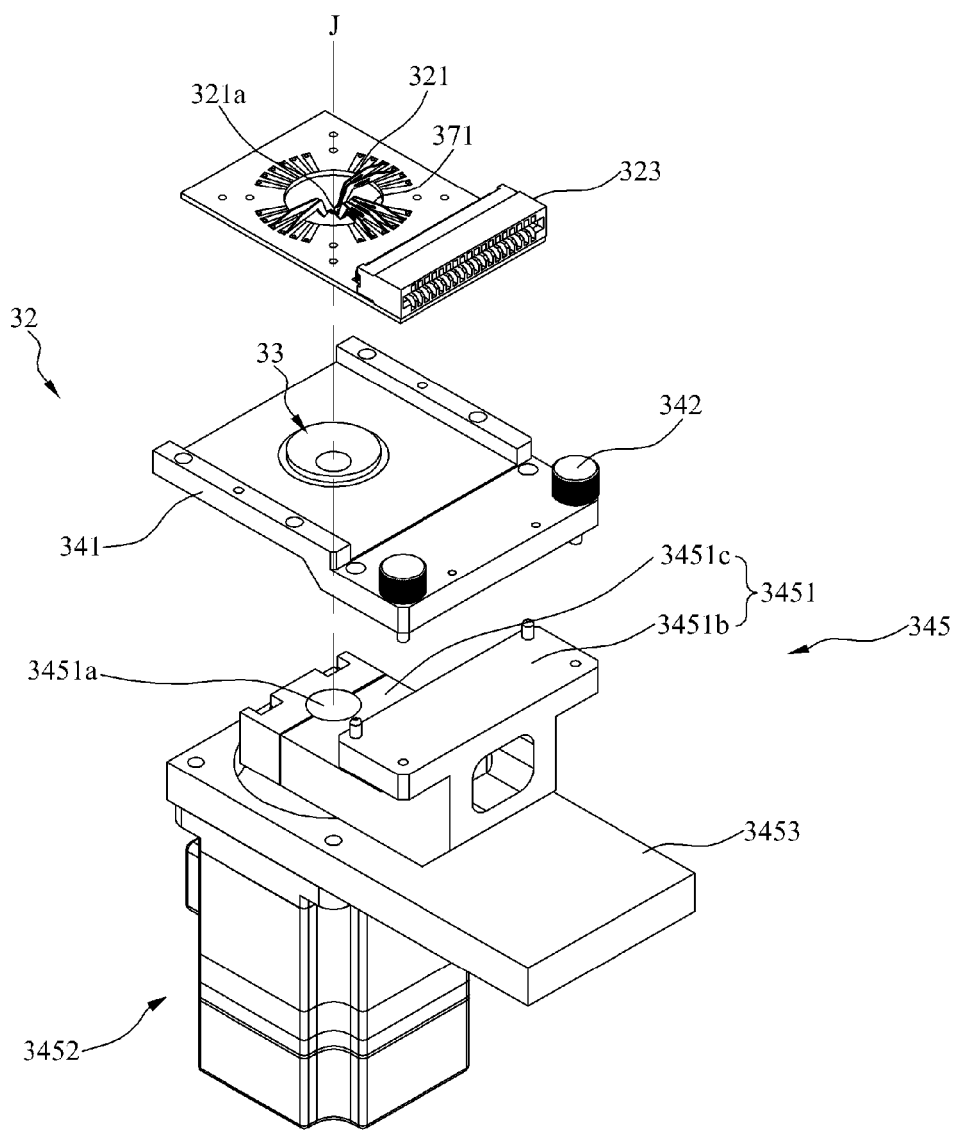
FIG. 19 is an exploded perspective view of FIG. 18.

Referring to FIGS. 1 to 17, a process for bringing the contact pins 321 into contact with the LED chip by means of the contact rotation mechanism 345 in accordance with the first example will be described below. FIGS. 15 to 17 are schematic diagrams for describing an operational principle of the contact rotation mechanism 345 in accordance with the first example, wherein the figures illustrate the enlarged view of FIG. 14 and the contact rotational axis 3451a.

First, the LED chip may be located at the testing position TP in such a state as illustrated in FIG. 15 after rotated at a certain distance and at a certain angle from the position and the direction as illustrated in FIG. 14. A dashed line of FIG. 15 indicates a mounting state of the LED chip on the mounting member 21 at the position and in the direction as illustrated in FIG. 14, while a solid line of FIG. 15 indicates a mounting state of the LED chip on the mounting member 21 after the LED chip at the testing position TP is moved or rotated for the various reasons as described above.

In this state, the contact driving mechanism 3452 rotates the contact rotation member 3451 about the contact rotational axis 3451a at an angle corresponding to the angle at which the LED chip located at the testing position is rotated. The contact driving mechanism 3452 is capable of rotating the contact rotation member 3451 about the contact rotational axis 3451a in a counterclockwise direction, as illustrated in FIG. 16. In such a case, the contact unit 32 would be previously raised by the contact driving mechanism 343 so as not to collide with the mounting member 21 and the LED chip located at the testing position TP. The first conveyance member 33 may be located at the first position.

After the contact pins 321 are rotated at the angle allowing them to be brought into contact with the respective pads P1 and P2 of the LED chip located at the testing position TP, the contact movement mechanism 344 moves the contact supporting mechanism 341 so as to locate the contact pins 321 above the pads P1 and P2 of the LED chip at the testing position TP, as illustrated in FIG. 17. This movement can be implemented as the contact movement mechanism 344 moves the contact elevating mechanism 343 in the first horizontal direction (X-axis direction, shown in FIG. 1) and the second horizontal direction (Y-axis direction, shown in FIG. 1).

If the contact pins 321 are located above the pads P1 and P2 of the LED chip placed at the testing position TP, the contact elevating mechanism 343 lowers the contact unit 32, thus allowing the contact pins 321 to come into contact with the respective pads P1 and P2 of the LED chip located at the testing position TP. This movement can be implemented by lowering the contact coupling mechanism 3453 by means of the contact elevating mechanism 343. The first conveyance member 33 may be lowered by the contact elevating mechanism 343 and thus located at the second position.

Referring to FIGS. 1 to 13 and FIGS. 18 to 20, in the contact rotation mechanism 345 in accordance with a second example, the contact driving mechanism 3452 is configured to rotate the contact rotation member 3451 about a contact rotational axis 3451a positioned below the mounting member 21 located at the testing position TP. The mounting member 21 located at the testing position TP may be positioned between the contact unit 32 and the contact rotational axis 3451a.

The contact rotation member 3451 may include a vertical frame 3451b coupled to the contact supporting mechanism 341 and a horizontal frame 3451c rotatably coupled to the contact coupling mechanism 3453. The contact driving mechanism 3452 is capable of rotating the contact rotation member 3451 about the contact rotational axis 3451a provided at the horizontal frame 3451c.

The vertical frame 3451b may be formed at a height position allowing the mounting member 21 loaded at the testing position TP to be located between the contact unit 32 and the horizontal frame 3451c. The horizontal frame 3451c may be elongated from the vertical frame 3451b toward the mounting member 21 located at the testing position TP so as to allow the contact rotational axis 3451a to be positioned below the mounting member 21 at the testing position TP. The contact rotation member 3451 may be formed in an "L" shape, for example.

Accordingly, as compared to the contact rotation mechanism 345 in accordance with the first example described above, in this second example, the distance from one end 321a of the contact pin 321 to the contact rotational axis 3451a can be reduced. Thus, after the contact pins 321 are rotated so as to be brought into contact with the respective pads P1 and P2 of the LED chip at the testing position, a distance by which the contact movement mechanism 344 moves the contact supporting mechanism 341 so as to locate the contact pins 321 above the pads P1 and P2 of the LED chip TP at the testing position TP can be reduced.

The contact driving mechanism 3452 is capable of rotating the contact rotation member 3451 about the contact rotational axis 3451a provided on the same vertical line J as the one end 321a of the contact pin 321 which is brought into contact with the LED chip. In case that the contact unit 32 includes a plurality of contact pins 321, the contact rotational axis 321a may be located at the same vertical line J as one end 321a of at least one of the plurality of contact pins 321.

The contact driving mechanism 3452 is capable of rotating the contact rotation member 3451 about the contact rotational axis 3451a located on the same vertical line I (shown in FIG. 10) as the center of the insertion hole 3222. The contact rotational axis 3451a may be located at the same vertical line I as the center of the insertion hole 3222 and the first passing hole 331.

In case that the contact rotational axis 3451a is located on the same vertical line I as the center of the insertion hole 3222, a process for bringing the contact pins 321 into contact with the LED chip by means of the contact rotation mechanism 345 in accordance with the second example will be described below with reference to FIG. 13 and FIGS. 18 to 20.

Figure 20:
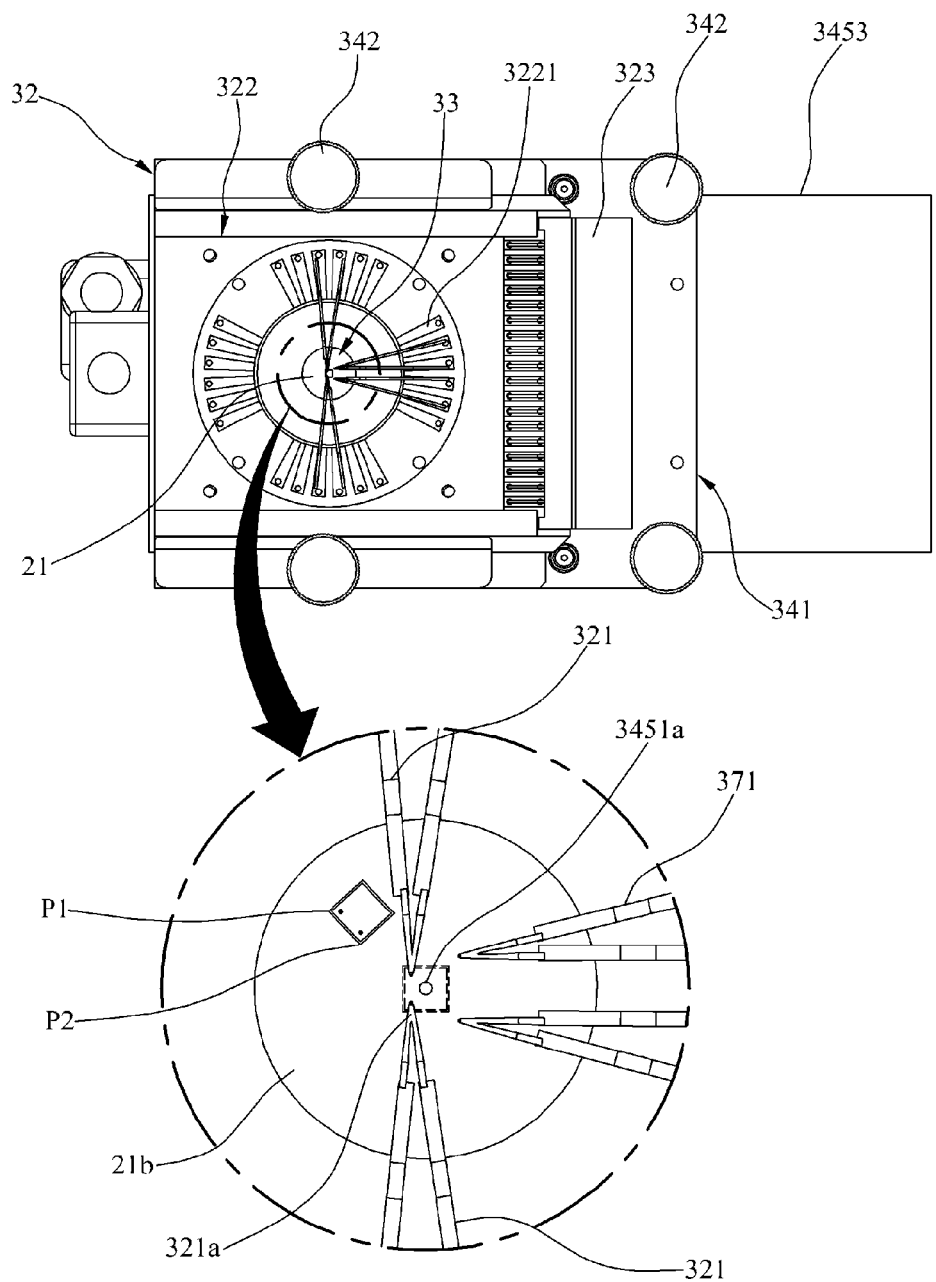
FIGS. 20 to 22 illustrate schematic operational statuses for describing a process of testing the LED chip by using the contact movement unit in accordance with the modification example of the embodiment of the present invention.

First, the LED chip may be located at the testing position TP in such a state as illustrated in FIG. 20 after rotated at a certain distance and at a certain angle from the position and the direction as illustrated in FIG. 14. In FIG. 20, A dashed line indicates the mounting state of the LED chip on the mounting member 21 at the position and in the direction as illustrated in FIG. 14, while a solid line indicates a mounting state of the LED chip on the mounting member 21 after the LED chip at the testing position TP is moved or rotated for the various reasons as described above.

Figure 21:
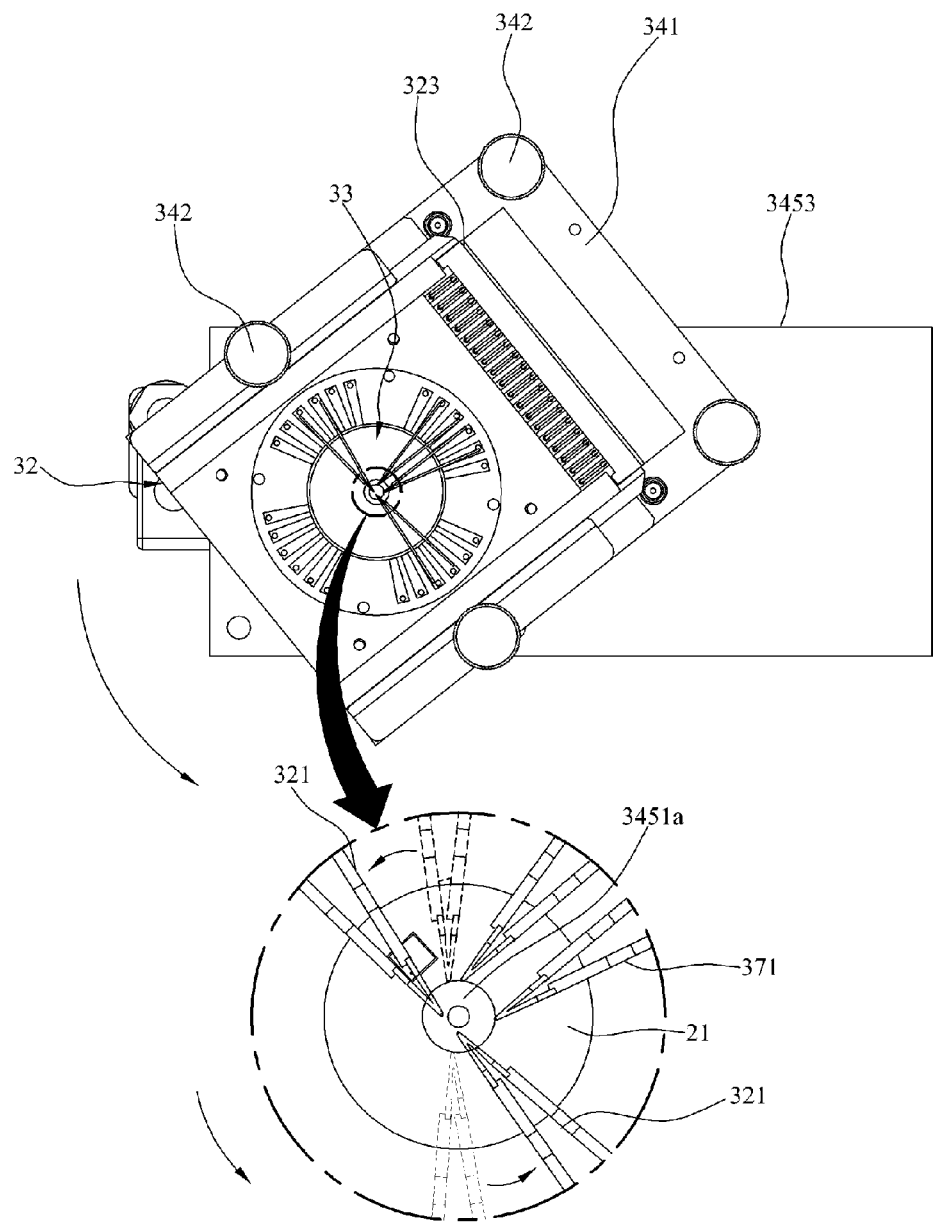

In this state, the contact driving mechanism 3452 rotates the contact rotation member 3451 about the contact rotational axis 3451a at an angle corresponding to the angle at which the LED chip located at the testing position is rotated. The contact driving mechanism 3452 is capable of rotating the contact rotation member 3451 about the contact rotational axis 3451a in a counterclockwise direction, as illustrated in FIG. 21.

Figure 22:
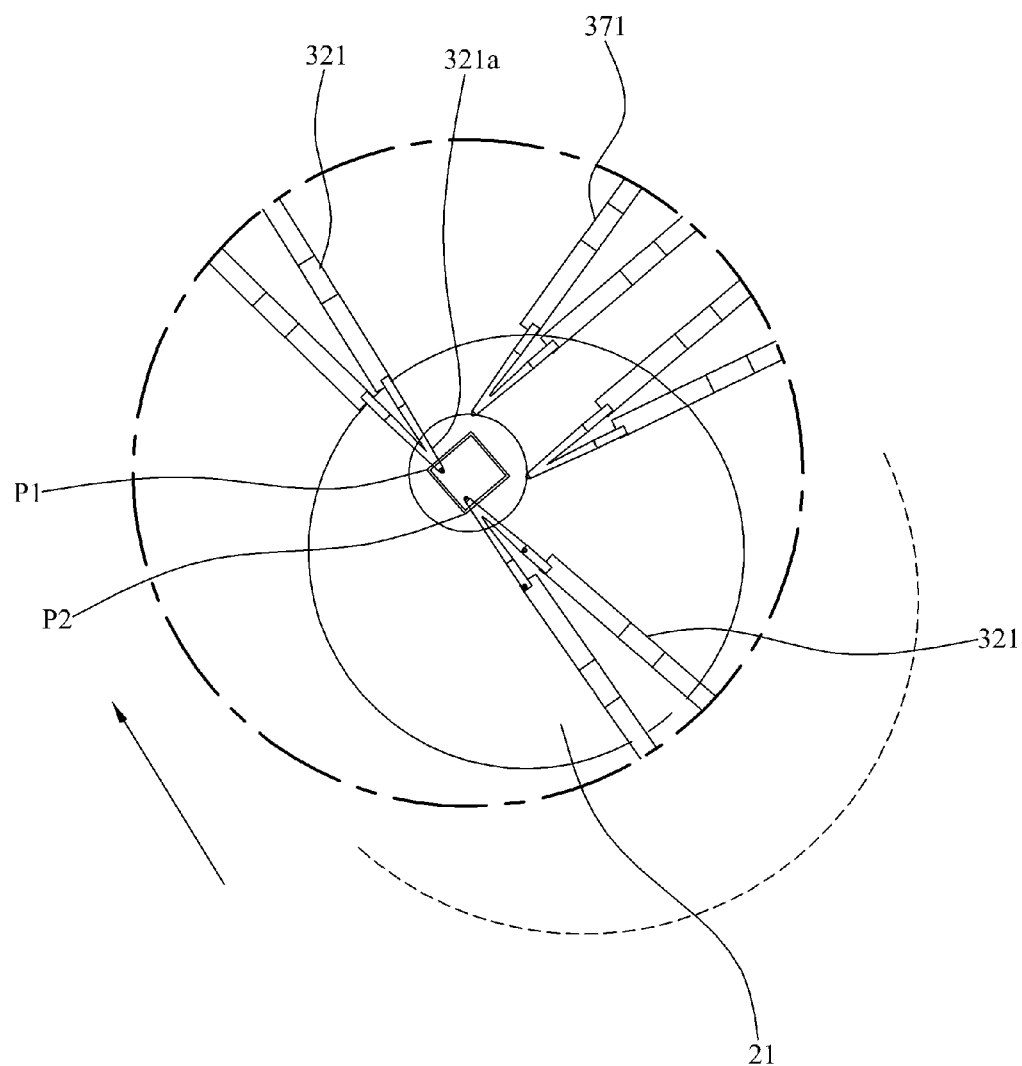
Figure 23:
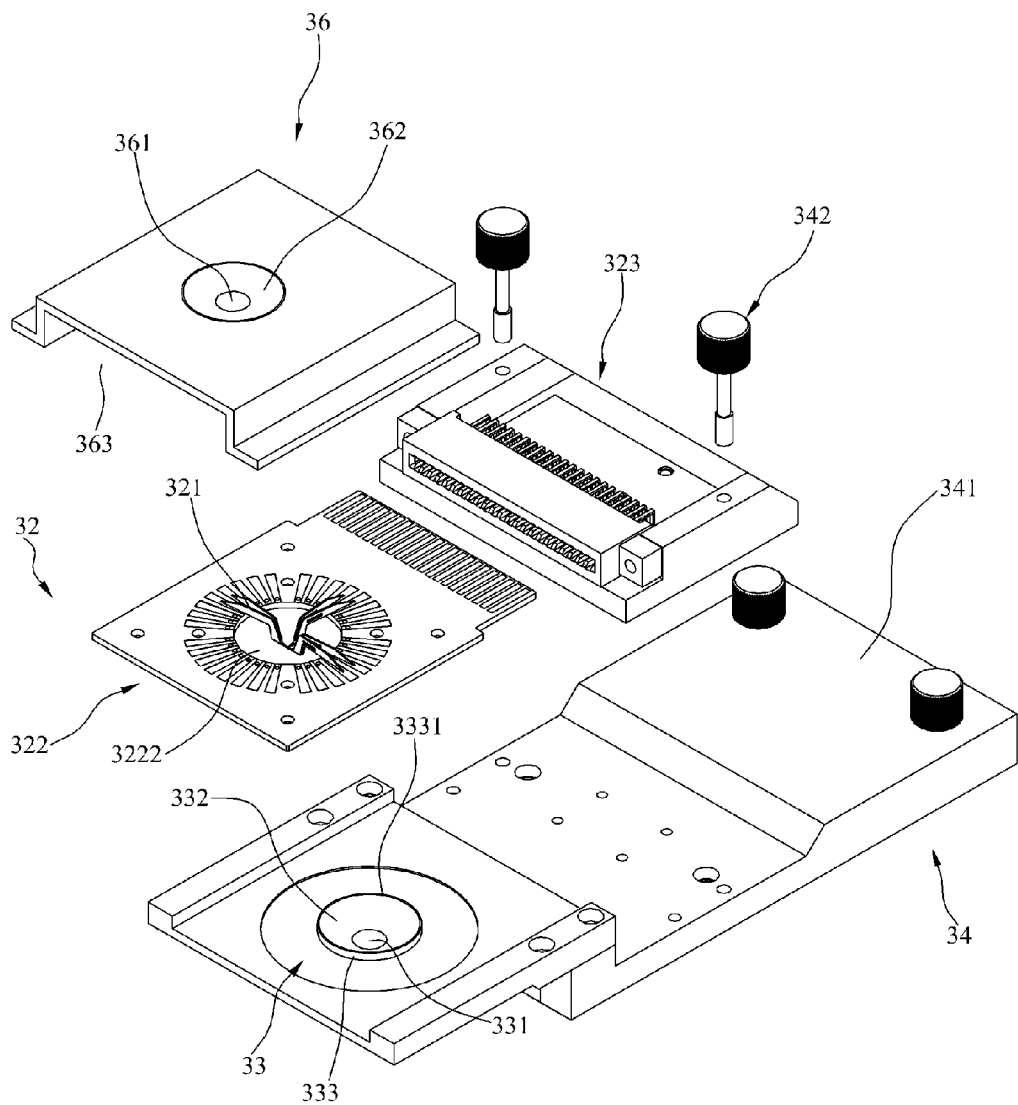
FIG. 23 is a schematic exploded view illustrating the contact unit, the movement unit, the first conveyance member and a second conveyance member.
Figure 24:
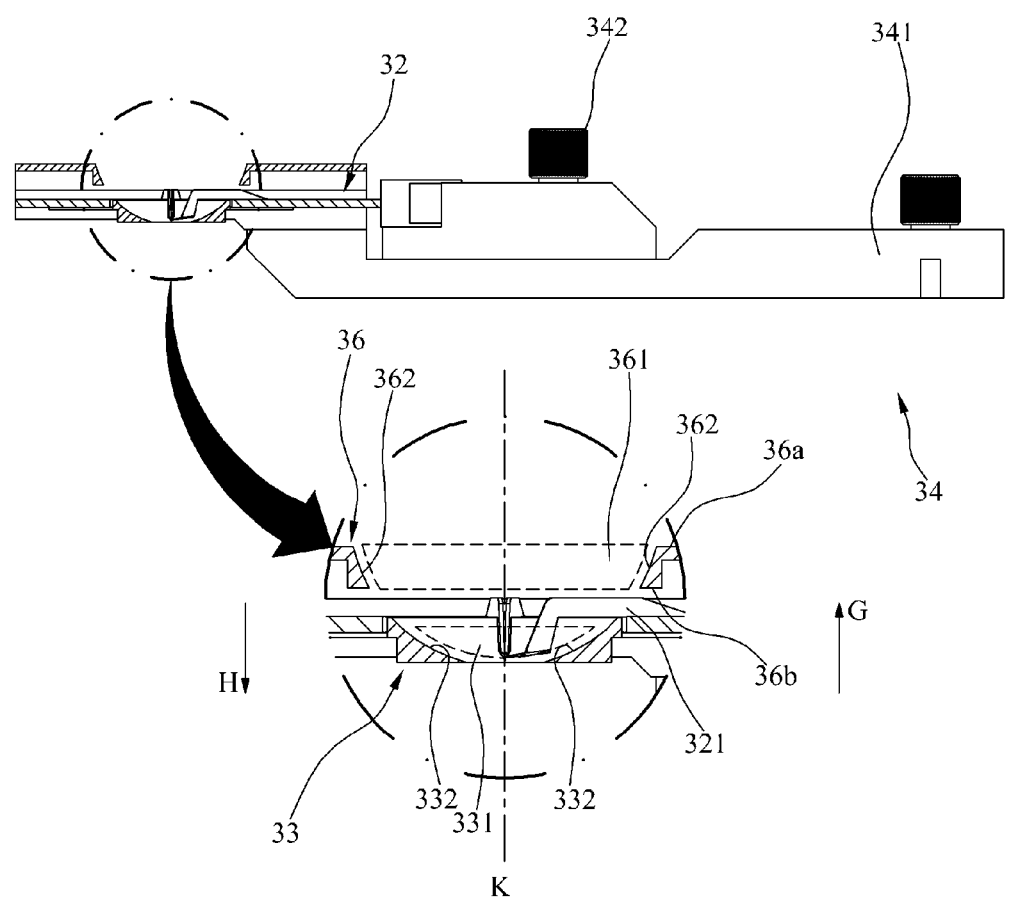
FIG. 24 is a side cross sectional view illustrating coupling of the components of FIG. 23.

After the contact pins 321 are rotated at the angle allowing them to be brought into contact with the respective pads P1 and P2 of the LED chip located at the testing position TP, the contact movement mechanism 344 moves the contact supporting mechanism 341 so as to locate the contact pins 321 above the pads P1 and P2 of the LED chip at the testing position, as illustrated in FIG. 22. This movement can be implemented as the contact movement mechanism 344 moves the contact elevating mechanism 343 in the first horizontal direction (X-axis direction, shown in FIG. 1) and the second horizontal direction (Y-axis direction, shown in FIG. 1). As compared to the contact rotation member 345 in accordance with the first example described above, in this second example, the contact movement mechanism 344 moves the contact supporting mechanism 341 by a shorter distance, still allowing the contact pins 321 to be located above the pads P1 and P2 of the LED chip TP at the testing position TP.

If the contact pins 321 are located above the pads P1 and P2 of the LED chip placed at the testing position TP, the contact elevating mechanism 343 lowers the contact unit 32, thus allowing the contact pins 321 to come into contact with the respective pads P1 and P2 of the LED chip located at the testing position TP. This movement can be implemented by lowering the contact coupling mechanism 3453 by means of the contact elevating mechanism 343. The first conveyance member 33 may be lowered by the contact elevating mechanism 343 and thus located at the second position.

Referring to FIG. 13, the main body 34 is installed next to the feeder 2. Coupled to the main body 34 are the contact movement unit 34 and the measurement unit 31. The main body 34 may include a first frame 351 coupled to the measurement unit 31 and elongated in a horizontal direction; a second frame 352 elongated in a downward direction (indicated by an arrow H) from the first frame; and a third frame 353 coupled to the second frame 352. The contact movement unit 34 may be coupled to a top surface of the third frame. The contact elevating mechanism 343 or the contact movement mechanism 344 may be coupled to the top surface of the third frame 353.

Referring to FIGS. 1 to 26, the LED chip testing device 1 may further includes a second conveyance member 36.

The second conveyance member 36 may be coupled to the contact movement unit 34 so as to be located between the measurement unit 31 and the contact unit 32. With this configuration, in the LED chip testing device 1, since a part of a gap between the measurement unit 31 and the contact unit 32 can be blocked by the second conveyance member 36, the amount of light that passes through the gap between the measurement unit 31 and the LED chip can be further reduced. The contact unit 32 may be coupled to the contact movement unit 34 so as to be located between the first conveyance member 33 and the second conveyance member 36. The second conveyance member 36 and the contact unit 32 may be respectively coupled to the contact supporting mechanism 341.

The second conveyance member 36 includes a second passing hole 361 and a second conveyance surface 362.

The second passing hole 361 may be formed through the second conveyance member 36. The light emitted from the LED chip can reach the inside of the measurement unit 31 after passing through the first passing hole 331, the second passing hole 361 and the light receiving hole 311. Accordingly, the light emitted from the LED chip can reach the inside of the measurement unit 31 without being blocked by the first conveyance member 33 and the second conveyance member 36.

The second passing hole 361 of the second conveyance member 36 may be formed such that its size is gradually reduced in a direction (indicated by the arrow H) facing toward the LED chip from the measurement unit 31. That is, the second passing hole 361 may be formed such that its diameter is gradually reduced in a downward direction (indicated by the arrow H) from a top surface 36a of the second conveyance member 36. The second passing hole 361 may be formed such that its diameter gradually decreases in the downward direction (indicated by the arrow H) from the top surface 36a of the second conveyance member 361.

The second conveyance surface 362 conveys the light emitted from the LED chip toward the measurement unit 31 so as to allow the light to reach the inside of the measurement unit 31 through the light receiving hole 311. With this configuration, since a greater amount of light can reach the inside of the measurement unit 31, the LED chip testing device 1 is capable of inspecting performance of the LED chip more accurately. The second conveyance surface 362 may be made of or coated with a material having a high reflectivity. To elaborate, the second conveyance surface 362 may be prepared by polishing a surface of a metal or a metal alloy, or may be prepared by mirror-coating a metal, a resin material or the like.

The second conveyance surface 362 may be formed along an outer surface of the second passing hole 361 so as to convey the light emitted from the LED chip toward the measurement unit 31. That is, as illustrated in an enlarged view of FIG. 24, the second conveyance surface 362 may be formed such that it is distanced away from a center K of the second passing hole 362 as it goes in an upward direction (indicated by an arrow G) from a bottom surface 36b of the second conveyance member 361. In case that the second passing hole 361 is formed such that its diameter is gradually reduce in the downward direction (indicated by the arrow H) from the top surface 36a of the second conveyance member 36, the second conveyance surface 362 may be formed in a curved surface shape.

The second conveyance surface 362 and the first conveyance surface 332 may be formed on a single curved surface. That is, when the first conveyance surface 332 and the second conveyance surface 362 are coupled, the first conveyance surface 332 and the second curved surface 362 may form a single curved surface. The light emitted from the LED chip can be conveyed to the measurement unit 31 by the first conveyance surface 332 and the second conveyance surface 362.

The second conveyance member 36 may further include a receiving groove 363 capable of receiving the contact pin 321 therein. The second conveyance member 36 may be coupled to the contact supporting mechanism 341 such that it is located between the measurement unit 31 and the contact unit 32 while the contact pin 321 is received in the receiving hole 363. The second conveyance member 36 may be formed in an inverted "U" shape, for example.

Figure 25:
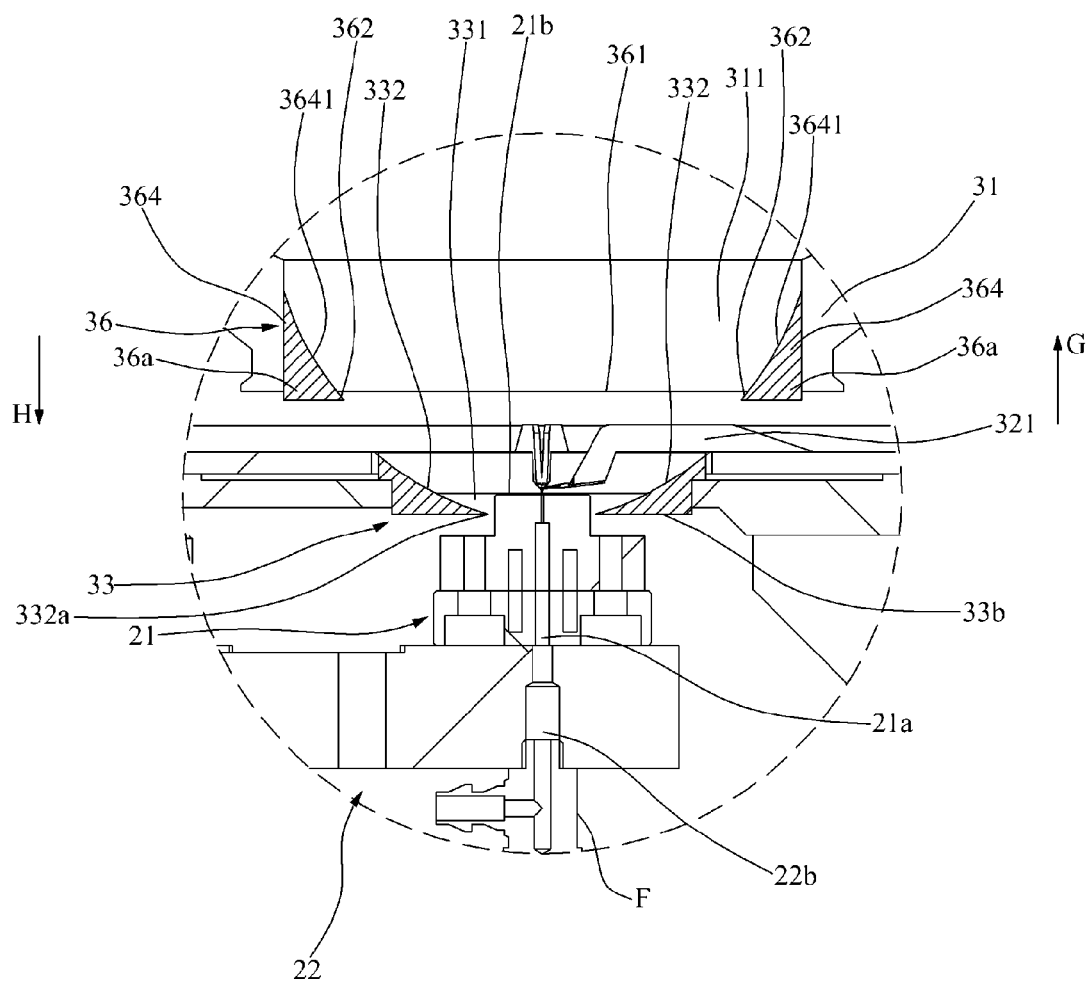
FIGS. 25 to 27 provide enlarged views of the part C of FIG. 7 to illustrate a second conveyance member in accordance with a modification example of the embodiment of the present invention.

Referring to FIG. 25, the second conveyance member 36 may further include a second protruding member 364. In FIG. 25, though the second conveyance member 36 is shown to be coupled to the measurement unit 31, the second conveyance member 36 may be coupled to the contact movement unit 34 while the second protruding member 364 is inserted in the light receiving hole 311.

The second protruding member 364 may be formed such that it protrudes in the direction (indicated by the arrow G) facing toward the measurement unit 31 from the LED chip located at the testing position TP. That is, the second protruding member 364 may be formed so as to project in the upward direction (indicated by the arrow G) from the top surface 36a of the second conveyance member 36. The second protruding member may be inserted in the measurement unit 31 through the light receiving hole 311.

The second protruding member 364 may be provided with a second inclined surface 3641 extended from the second conveyance surface 362. The second conveyance surface 362 and the second inclined surface 3641 may form a single curved surface. With this configuration, the second conveyance surface 362 and the second inclined surface 3641 are capable of conveying the light emitted from the LED chip toward the measurement unit 31.

Accordingly, since the second conveyance member 36's area for conveying the light emitted from the LED chip toward increases, a greater amount of light can reach the inside of the measurement unit 31, so that the LED chip testing device 1 is capable of inspecting performance of the LED chip more accurately. The second inclined surface 3641 may be made of or coated with a material having a high reflectivity. For example, the second inclined surface 3641 may be prepared by polishing a metal or a metal alloy, or may be prepared by mirror-coating a metal, a resin material, or the like.

Meanwhile, since the second conveyance member 36 can be coupled to the contact supporting mechanism 341 along with the contact unit 32 as described above, the second conveyance member 36 may have a function as a reinforcement plate that prevents deformation of the contact unit 32. In such a case, it may be desirable that the second conveyance member 36 and the contact unit 32 be strongly coupled to each other by a screw coupling mechanism or the like.

Though not shown, it may be possible to couple a separate reinforcement plate to the contact unit 32. For example, in case that the contact unit 32 is a probe card, the reinforcement plate may be a plate or a certain-shaped structure coupled to a top surface or a bottom surface of the probe card and capable of preventing deformation of the probe card. The reinforcement plate functions to prevent deformation of the probe card, such as bending, due to an external mechanical stress or a thermal stress. For the purpose, the reinforcement plate may be made of a material having higher strength and/or stiffness and lower thermal expansion coefficient as compared to those of the probe card. Accordingly, the reinforcement plate may be made of a metal or a metal alloy, or a non-metal material such as resin or ceramic. For example, such materials may include steel, titanium, nickel, invar, kovar, graphite, epoxy, ceramic, CFRP (Carbon Fiber-Reinforced Polymer), an alloy or a mixture of these materials and/or other materials.

Referring to FIGS. 1 and 2 and FIGS. 25 and 26, the second conveyance member 36 in accordance with a modification example may be coupled to the measurement unit 31.

The second conveyance member 36 may be coupled to the measurement unit 31 such that it projects in a direction (indicated by the arrow H) facing toward the LED chip at the testing position TP from the measurement unit 31. That is, the second conveyance member 36 may be coupled to the measurement unit 31 such that it projects in a downward direction (indicated by the arrow H) from the measurement unit 31.

As illustrated in FIG. 25, the second conveyance member 36 may be coupled to the measurement unit 31 while its protruding member 364 is inserted in the light receiving hole 311. With this configuration, since the second conveyance member 36's area for conveying the light emitted from the LED chip toward the measurement unit 31 increases, a greater amount of light can reach the inside of the measurement unit 31 in the LED chip testing device 1, and, thus, the performance of the LED chip can be inspected more accurately.

As the second protruding member 364 of the second conveyance member 36 is inserted into the light receiving hole 311, the second conveyance member 36 may be coupled to the measurement unit 31 by an insertion fitting mechanism. The second conveyance member 36 may be coupled to the measurement unit 31 by a fastening member such as bolts after the second protruding member 364 is inserted into the light receiving hole 311.

Figure 26:
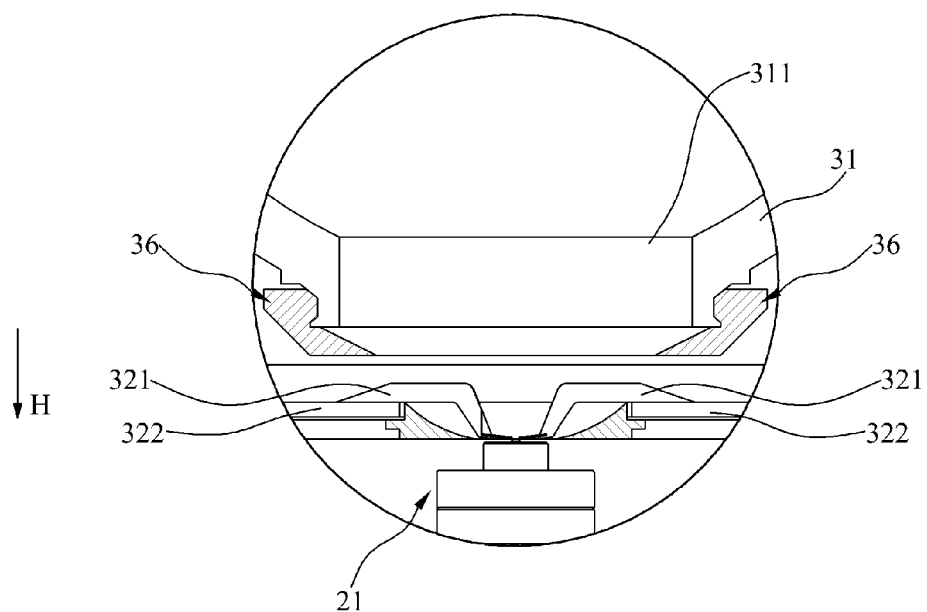
Figure 27:
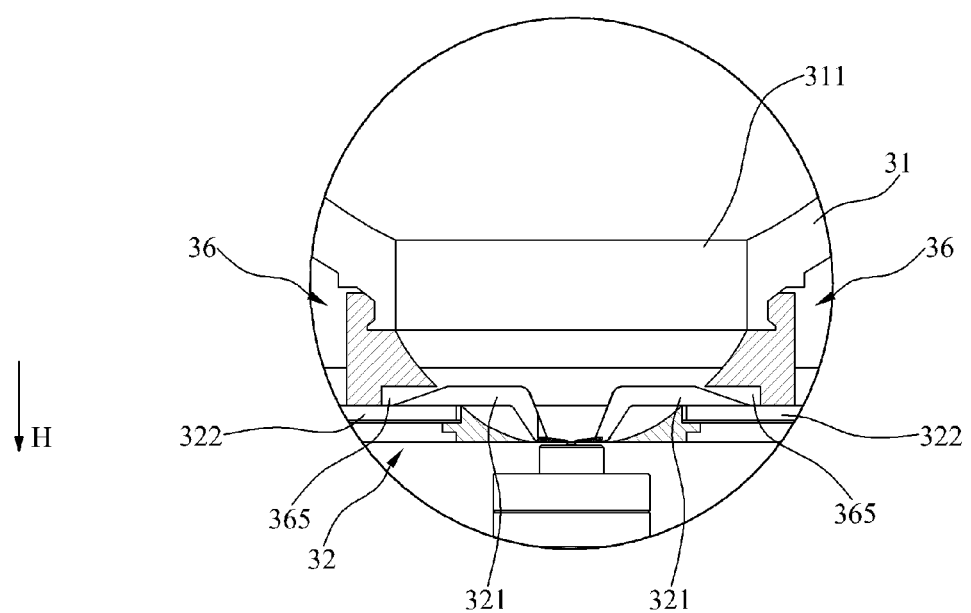
Figure 28:
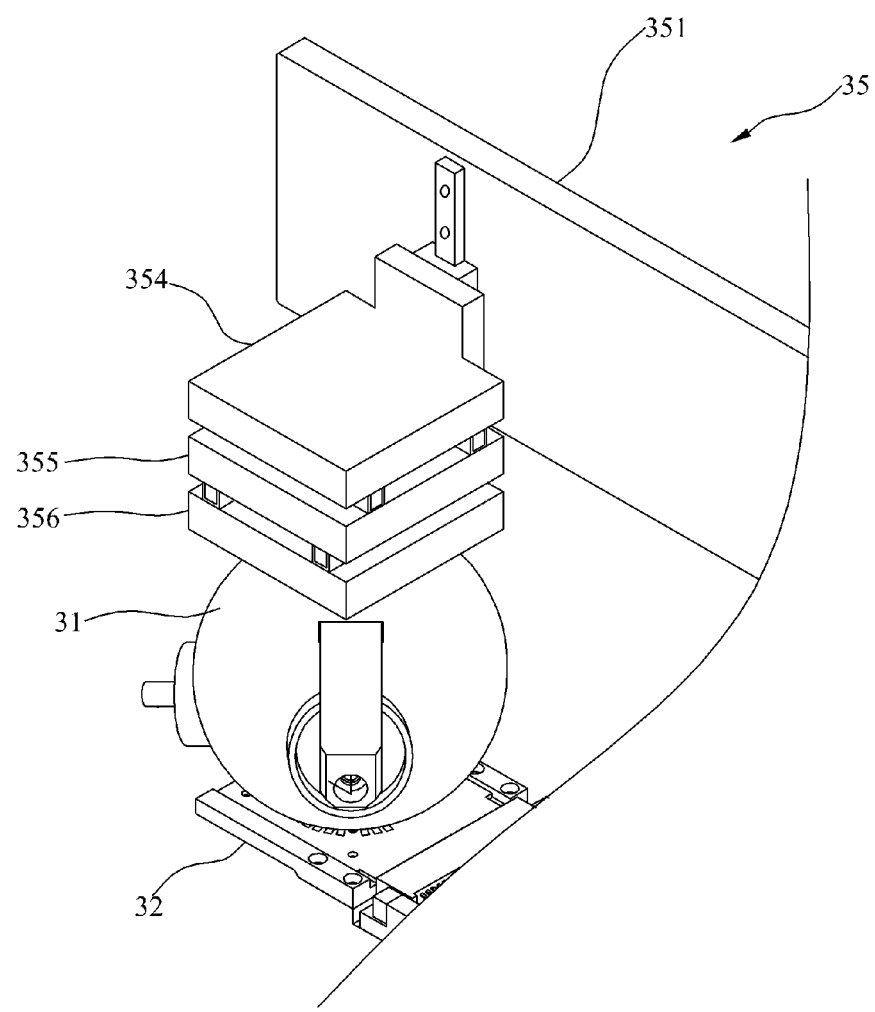
FIG. 28 is a schematic perspective view illustrating a measurement unit, a contact unit and a main body in accordance with a modification example of the embodiment of the present invention.

As shown in FIG. 26, the second conveyance member 36 may be coupled to the measurement unit 31 such that the measurement unit 31 is located at the second passing hole 361. The second conveyance member 36 may be coupled to the measurement unit 31 by the insertion fitting mechanism or by using the fastening member such as bolts.

Referring to FIGS. 1 and 2 and FIGS. 27 and 28, the second conveyance member 36 in accordance with another modification example may be coupled at one end to the measurement unit 31 and at the other end to the contact unit 32. The other end of the second conveyance member 36 may be coupled to the contact body 322. Though not shown, one side of the second conveyance member 36 may be coupled to the measurement unit 31 while the other side may be coupled to the contact supporting mechanism 341.

The second conveyance member 36 is provided with one or more insertion through holes 365 into which the contact pin 321 can be inserted. When the contact unit 32 includes the plurality of contact pins 321, a plurality of insertion groove 365 may be formed in the second conveyance member 36. The same number of insertion grooves 365 as that of the contact pins 321 may be formed in the second conveyance member 36.

While the contact pin 321 is inserted in the insertion groove 365, the one side of the second conveyance member 36 may be coupled to the measurement unit 31 while the other side is coupled to the contact main body 322. With this configuration, since the gap between the measurement unit 31 and the contact unit 32 can be blocked by the second conveyance member 36, the light emitted from the LED chip can be prevented from passing through between the measurement unit 31 and the LED chip. Accordingly, a greater amount of light can reach the inside of the measurement unit 31, the LED chip testing device 1 is capable of inspecting the performance of the LED chip more accurately.

In case that the second conveyance member 36 is coupled to the measurement unit 31 and the contact main body 322, the measurement unit 31 can be movably coupled to the main body 35. In this configuration, when the contact unit 32 is moved by the contact movement unit 34, the measurement unit 31 connected with the contact unit 32 can also be moved. For this purpose, the main body 35 may include a first connecting frame 354, a second connecting frame 355 and a third connecting frame 356. The measurement unit 31 may be coupled to the third connecting frame 356.

The first connecting frame 354 can be coupled to the first frame 351 such that it can be moved up and down. Accordingly, when the contact movement unit 354 elevates the contact unit 32 up and down, the first connecting frame 354 can also be elevated up and down, and, thus, the measurement unit 31 can be elevated up and down. The first frame 351 may include an LM rail, and the first connecting frame 354 may include an LM block movably coupled to the first frame 351.

The second connecting frame 355 can be coupled to the first connecting frame 354 such that it can be moved in the first horizontal direction (X-axis direction). Accordingly, if the contact movement unit 34 moves the contact unit 32 in the first horizontal direction (X-axis direction), the second connecting frame 355 can be moved in the first horizontal direction (X-axis direction), and, thus, the measurement unit 31 can also be moved in the first horizontal direction (X-axis direction). Further, the first connecting frame 354 may include an LM rail, and the second connection frame 355 may include an LM block movably coupled to the LM rail of the first connecting frame 354.

The third connecting frame 356 may be coupled to the second connecting frame 355 such that it can be moved in the second horizontal direction (Y-axis direction) perpendicular to the first horizontal direction (X-axis direction). Accordingly, if the contact movement unit 34 moves the contact unit 32 in the second horizontal direction (Y-axis direction), the third connecting frame 356 can be moved in the second horizontal direction (Y-axis direction), and, thus, the measurement unit 32 can also be moved in the second horizontal direction (Y-axis direction). The second connecting frame 355 may include an LM rail, and the third connecting frame 356 may include an LM block movably coupled to the LM rail of the second connecting frame 355.

The measurement unit 31 may be rotatably coupled to the third connecting frame 356. Accordingly, if the contact movement unit 34 rotates the contact unit 32, the measurement unit 31 may be also rotated.

As described above, since the measurement unit 31 is also moved when the contact movement unit 31 moves the contact unit 32 so as to allow the contact pin 321 to be brought into contact with the LED chip located at the testing position TP, the LED chip at the testing position TP can be tested while it is located at the same vertical line as the center of the light receiving hole 311 regardless of its mounting state on the mounting member 21. Thus, the LED chip testing device 1 is capable of inspecting the performance of the LED chip more accurately.

Figure 29:
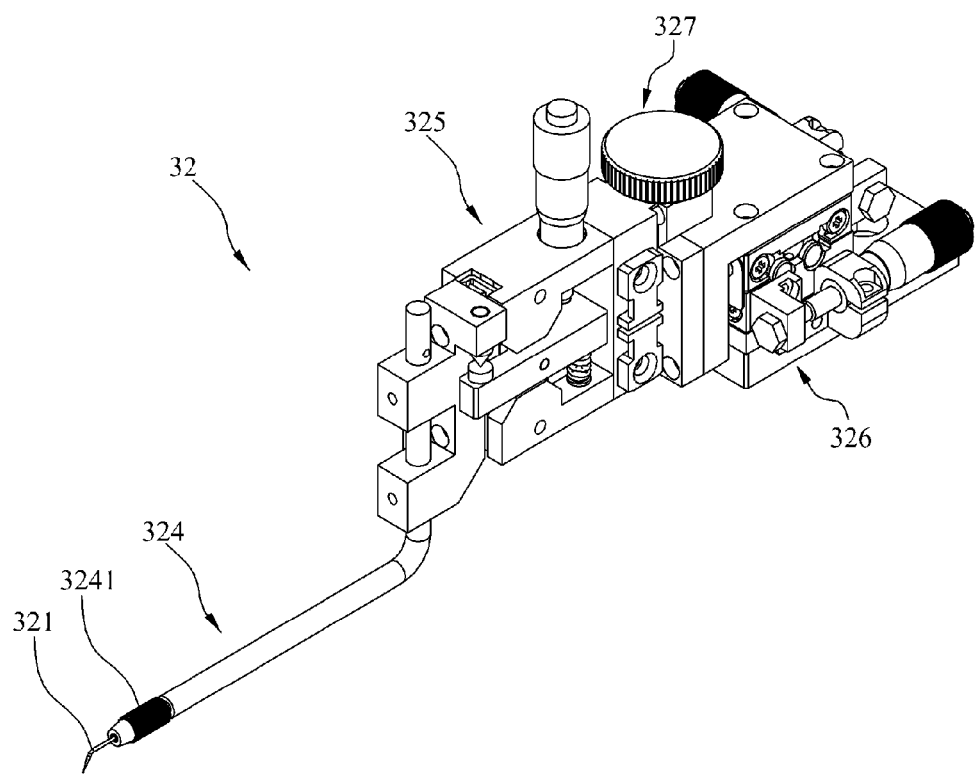
FIGS. 29 and 30 are perspective views of a contact unit in accordance with a modification example of the embodiment of the present invention.
Figure 30:
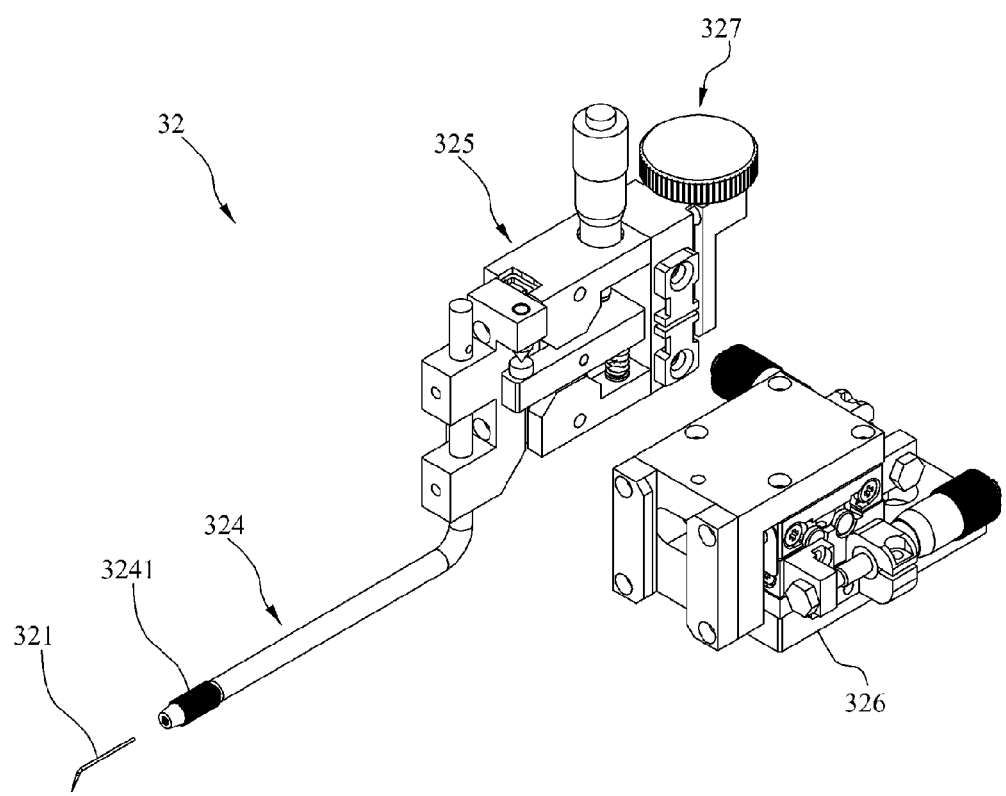
Figure 31:
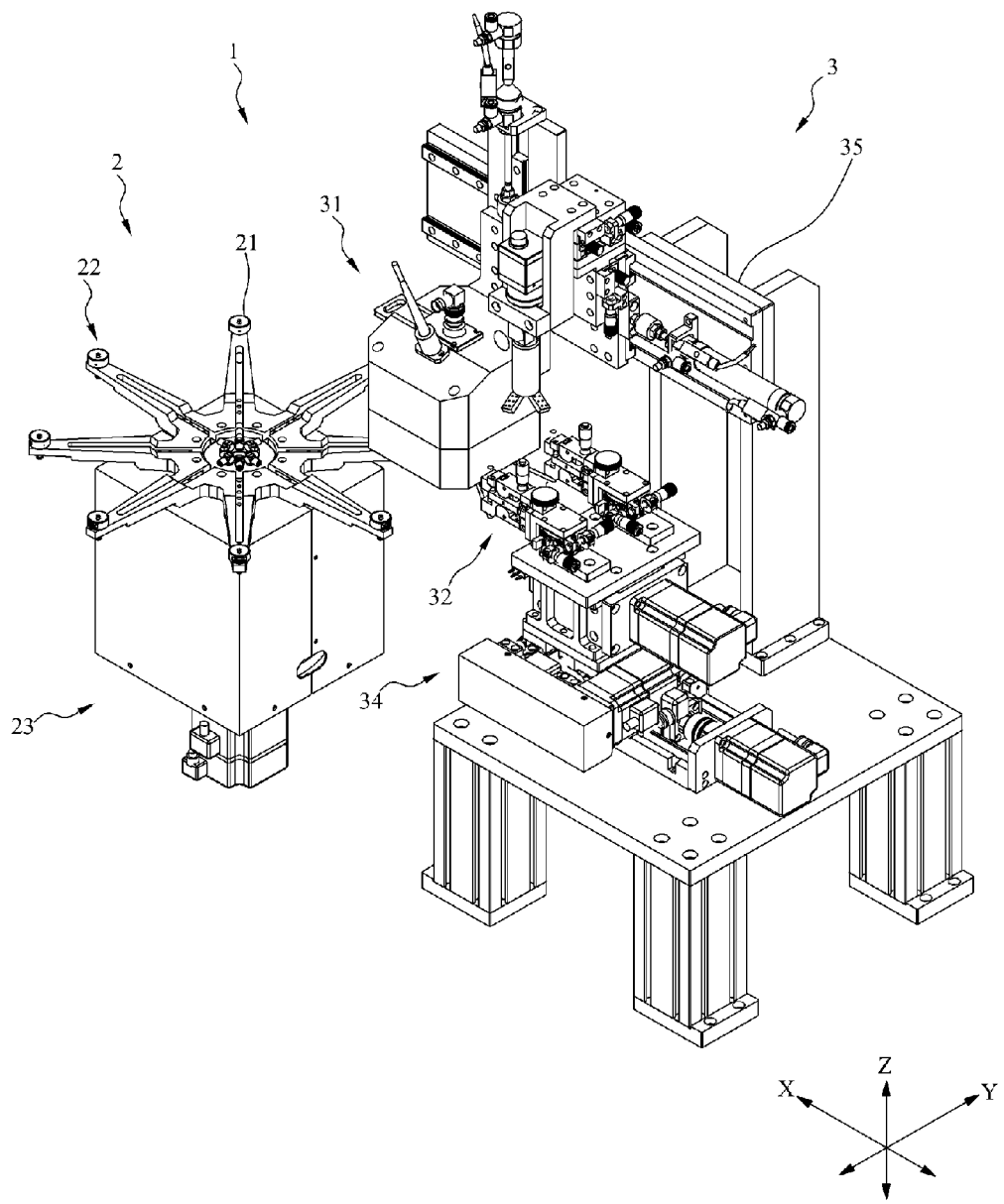
FIG. 31 is a schematic perspective view of an LED chip testing device including a contact unit in accordance with a modification example of the embodiment of the present invention.

Referring to FIGS. 29 to 31, the contact unit 32 in accordance with a modification example of the embodiment of the present invention may include a contact pin 321, a first body 324, a second body 325, a third body 326 and a coupling member 327. The contact unit 32 can be elevated up and down by the contact movement unit 34 and can be moved in the first horizontal direction (X-axis direction) and the second horizontal direction (Y-axis direction). The tester 3 may include a plurality of contact units 32 in accordance with the modification example of the embodiment of the present invention.

Coupled to the first body 324 is the contact pin 321. The first body 324 is coupled to the second body 325. The first body 324 may be elongated in a direction facing toward the LED chip at the testing position TP from the second body 325. The first body 324 may be electrically connected with the testing device (not shown), and the contact pin 321 may be electrically connected with the testing device (not shown) through the first body 324.

The contact pin 321 may be detachably coupled to the first body 324 via a connecting member 3241. Accordingly, when the contact pin 321 is damaged or broken, a user only needs to replace the contact pin 321 easily. Even in case of replacing the to-be-tested LED chip with a new LED chip having different specifications, the user can replace the contact pin 321 with a new one suitable for the specifications of the LED chip.

The connecting member 3241 may be rotatably coupled to the first body 324. As the connecting member 3241 is rotated in one direction, the connecting member 3241 applies a forth to the first body 324, so that the contact pin 321 can be coupled to the first body 324. As the connecting member 3241 is rotated in the other direction, the force applied from the connecting member 3241 to the first body 324 is eliminated, so that the contact pin 321 can be rendered separable from the first body 324. A fastening member (not shown) such as bolts can be used as the connecting member 3241.

The first body 324 is coupled to the second body 325. The second body 325 and the third body 326 may be detachably coupled to each other via the coupling member 327. Accordingly, when the contact pin 321 needs to be replaced, the contact pin 321 can be easily separated by separating the second body 325 from the third body 326. The second body 325 may be electrically connected with the testing device (not shown), and the contact pin 321 may be electrically connected with the testing device (not shown) through the first body 324 and the second body 325.

The second body 325 is coupled to the third body 326. The second body 325 can be detachably coupled to the third body 326 via the connecting member 327, and the third body 326 can be coupled to the contact movement body 324. AS the third body 326 is moved by the contact movement unit 324, the second body 325, the first body 324 and the contact pin 321 can also be moved together. The third body 326 may be electrically connected with the testing device (not shown), and the contact pin 321 can be electrically connected with the testing device (not shown) through the first body 324, the second body 325 and the third body 326.

The connecting member 327 detachably couples the first body 325 and the third body 326. A fastening member (not shown) such as bolts can be used as the coupling member 327.

Figure 32:
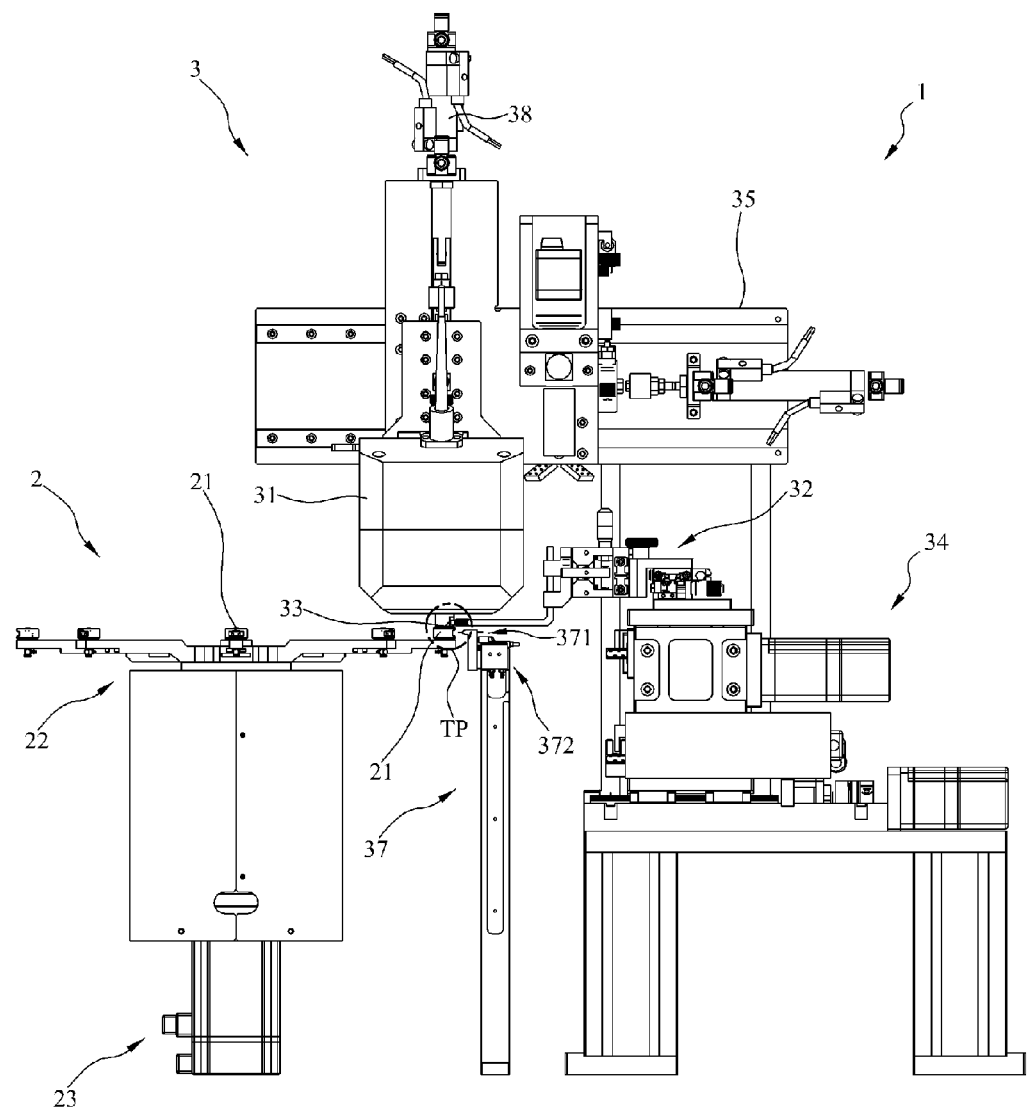
FIG. 32 is a schematic front view of a LED chip testing device in accordance with a modification example of the embodiment of the present invention.
Figure 33:
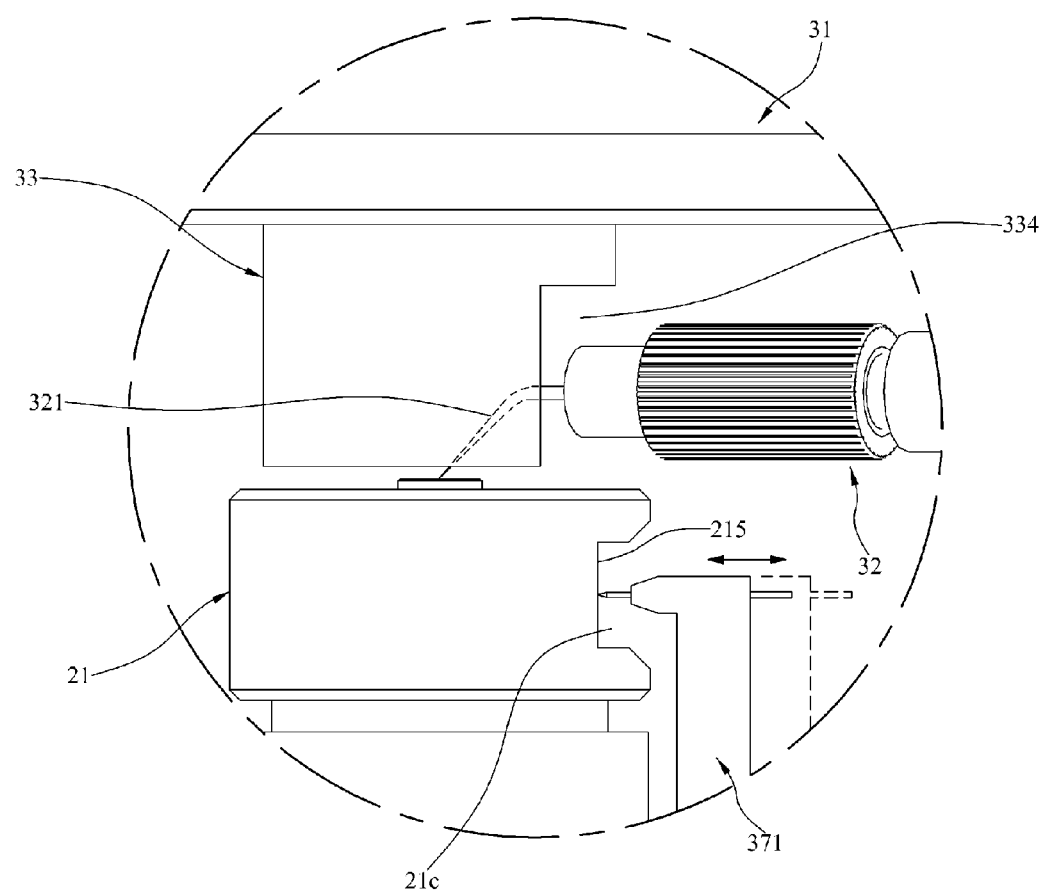
FIG. 33 is a schematic enlarged view illustrating a testing position of FIG. 32.

Referring to FIGS. 31 to 33, the tester 3 in accordance with a modification example of the present embodiment may further include a contact mechanism 37.

The contact mechanism 37 has a contact part 371. The contact mechanism 371 may be installed next to the rotation member 22 so that the contact part 371 can come into contact with the mounting member 21 located at the testing position TP.

After the contact pin 371 comes into contact with the contact member 21 at the testing position TP and the contact pin 321 is brought into contact with the LED chip, the LED chip can emit light by a power supplied through the contact unit 32 and the contact part 371. The contact unit 32 and the contact mechanism 37 are capable of making the LED chip emit light in cooperation with the testing device (not shown). The contact unit 32 and the contact mechanism 37 are capable of testing the electrical characteristics of the LED chip in cooperation with the testing device (not shown).

The contact part 371 can be brought into contact with a lateral surface of the mounting member 21 located at the testing position TP. The contact part 371 may be elongated toward the mounting member 21 located at the testing position TP.

The contact mechanism 37 may further include a contact movement means 372 that moves the contact part 371 toward or away from the mounting member 21.

If the LED chip to be tested is located at the testing position TP, the contact movement means 372 moves the contact part 371 so as to allow the contact part 371 to approach the mounting member 21 located at the testing position TP. The contact part 371 can be brought into contact with the mounting member 21 at the testing position TP by being moved by the contact movement means 372.

If the testing of the LED chip is completed, the contact movement unit 372 moves the contact part 371 so as to allow the contact part 371 to move away from the mounting member 21 located at the testing position TP. The contact part 371 is moved by the contact movement means 372 and is spaced apart from the mounting member 21 located at the testing position TP.

Accordingly, when the rotation member 22 is rotated so as to locate a new to-be-tested LED chip at the testing position TP, a contact or collision between the mounting member 21 and the contact part 371 can be avoided. Accordingly, the mounting member 21 and the contact part 371 can be prevented from being worn out by friction or damaged by collision.

The contact movement means 372 is capable of moving the contact part 371 by using a hydraulic cylinder or a pneumatic cylinder. The contact movement unit 372 is capable of moving the contact part 371 by using a motor and a converting mechanism that converts a rotary motion of the motor into a linear motion. The converting mechanism may be a pulley and a belt, a rack-pinion gear, a ball screw, a cam member, or the like. The contact part 371 is coupled to the contact movement means 372.

Here, in case that the mounting member is formed in a cylindrical shape, the contact part 371 may not come into contact with the mounting member 21 exactly due to sliding or the like that has occurred while it is being brought into contact with the mounting member 21. To prevent this problem, the contact member 21 may further include a contact surface 215 that would become in contact with the contact part 371.

The contact surface 215 may be formed at the mounting member 21's lateral surface that faces toward the contact part 371 when the mounting member 21 is located at the testing position TP. By the presence of the contact surface 215, the mounting member 21's lateral surface facing the contact part 317 can form a plane. Accordingly, when the contact part 371 is brought into contact with the mounting member 21, sliding of the contact part 371 or the like can be minimized, so that the LED chip testing device 1 in accordance with the present invention is capable of testing the LED chip while the contact part 371 is in contact with the mounting member 21 exactly.

The mounting member 21 may have a contact surface 215, and the contact surface 215 and the contact part 371 become perpendicular to each other when the contact part 371 is brought into contact with the contact surface 215. The mounting member 21 may have a contact groove 21c depressed in a certain depth in the lateral surface where the contact surface 215 is located.

The contact part 371 in accordance with the modification example of the present embodiment may be coupled to the contact body 322, as illustrated in FIGS. 20 to 22. The contact part 371 may be coupled to the contact body 322 such that it comes into contact with the top surface 21b of the mounting member 21 located at the testing position TP when the contact pin 321 is brought into contact with the LED chip located at the testing position TP. The contact part 371 may be also brought into contact with the contact member 211 (shown in FIG. 3).

Accordingly, by moving the contact unit 32 by means of the contact movement unit 34, the contact pin 321 can be brought into contact with the LED chip located at the testing position TP and the contact part 371 can be brought into contact with the top surface 21b of the mounting member 21 located at the testing position TP.

Referring to FIGS. 32 and 33, the first conveyance member 33 in accordance with a modification example of the present embodiment may be provided at the measurement unit 31 such that it projects in a direction facing toward the LED chip at the testing position from the measurement unit 31. In case that the measurement unit 31 is located above the LED chip when the LED chip is tested, the first conveyance member 33 may be formed such that it projects downward from the measurement unit 31.

Though not shown, the first conveyance member 33 may be installed at the mounting member 21 such that it projects in a direction facing toward the measurement unit 31 from the mounting table. In case that the measurement unit 31 is located above the LED chip when the LED chip is tested, the first conveyance member 33 may be formed such that it projects upward from the mounting member 21. The LED chip can be located inside the first conveyance member 33

The first conveyance member 33 is provided with a groove 334 into which the contact pin 321 is inserted. Accordingly, even in case that the measurement unit 31 is located between the measurement unit 31 and the LED chip, the LED chip can be tested with the first conveyance member 33 located close to the LED chip. Thus, since a greater amount of light emitted from the LED chip is allowed to reach the measurement unit 31 by the presence of the first conveyance member 33, the performance of the LED chip can be inspected more accurately.

The first conveyance member 33 may be formed in a hollow cylindrical shape. The groove 334 may be formed at the conveyance member 33 in a side facing toward the contact unit 32. The first conveyance member 33 may be made of or coated with a material having a high reflectivity. For example, the first conveyance member 33 may be prepared by polishing a metal or a metal alloy, or may be prepared by mirror-coating a metal, a resin material, or the like.

The groove 334 formed at the first conveyance member 33 may have a size allowing the contact pin 321 to be inserted therethrough. The contact pin 321 may be brought into contact with the LED chip located at the testing position TP after passing through the groove 334.

Referring to FIGS. 32 and 33, the tester 3 in accordance with a modification example of the present embodiment may further include a measurement elevating unit 38.

The measurement elevating unit 38 may be coupled to the main body 34 and serve to elevate the measurement unit 31 up and down. The measurement unit 31 may be coupled to the first frame 351 such that it can be elevated up and down.

The measurement elevating unit 38 may serve to elevate the measurement unit 31 upward when the rotation unit 23 rotates the rotation member 22. If the to-be-tested LED chip is located at the testing position TP, the measurement elevating unit 38 may move the measurement unit 31 downward. Accordingly, the LED chip testing device 1 in accordance with the present invention is capable of testing the LED chip at the testing position while the LED chip is maintained close to the measurement unit 31.

Thus, since a greater amount of light emitted from the LED chip is allowed to reach the measurement unit 31 by the first conveyance member 33, the performance of the LED chip can be inspected more accurately.

In case that the first conveyance member 33 is installed at the mounting member 21, the LED chip testing device 1 is capable of testing the LED chip while maintaining the measurement unit 31 close to the first conveyance member 33 and reducing the possibility of the collision of the first conveyance member 33 with the measurement unit 31. It may be also possible to test the LED chip while the first conveyance member 33 is inserted into the measurement unit 31 or while the first conveyance member 33 is in contact with the measurement unit 31.

Accordingly, since a greater amount of light emitted from the LED chip is allowed to reach the inside of the measurement unit 31, the first conveyance member 33 the LED chip testing device 1 in accordance with the present invention is capable of inspecting the LED chip more accurately.

The measurement elevating unit 38 may elevated the measurement unit 31 up and down by using a hydraulic cylinder, a pneumatic cylinder, or the like. The measurement elevating unit 38 may elevate the measurement unit 31 up and down by using a motor; and a connecting means coupled to the motor and the measurement unit respectively. The connecting means may be a pulley and a belt, a ball screw, a cam member, or the like.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

The present invention provides an LED chip testing device capable of accurately measuring performance of the LED chip, reducing materials costs and processing costs without performing unnecessary package process and test process onto the LED chip, and reducing manufacturing costs.

What is claimed is:

1. A light emitting diode (LED) chip testing apparatus that measures characteristics of an LED chip, the apparatus comprising:

a rotation member that supports the LED chip and rotates the LED chip to a testing position where the characteristics of the LED chip are tested, wherein the rotation member includes:

a plurality of supporting frames, each of the plurality of supporting frames extending in radial directions with respect to a rotational axis such that the plurality of supporting frames are separated from each other; and a plurality of mounting members, each of which is installed at an end portion of corresponding one of the plurality of supporting frames and serves to mount thereon the LED chip;

a tester installed next to the rotation member and serving to measure the characteristics of the LED chip at the testing position, wherein the tester includes:

a contact unit that comes into contact with the LED chip at the testing position and thus makes the LED chip light emit; and a measurement unit that measures an optical characteristic of the LED chip at the testing position; and a conveyance member that reflects the light emitted in a lateral direction from the LED chip and conveys the reflected light toward the measurement unit, wherein:
the conveyance member includes a conveyance surface that conveys the light emitted from the LED chip to the measurement unit;
the conveyance surface is provided with a passing hole through which the light emitted from the LED chip passes;
a size of the passing hole is gradually reduced in a direction facing toward the LED chip located at the testing position from the measurement unit; and
the entire or a part of the conveyance surface is covered with a mirror coating.

2. The LED chip testing device of claim 1, wherein the entire or a part of the mounting member is made of a material containing any one of sapphire, crystal, glass, a ferroalloy, a copper alloy, an aluminum allow, stainless steel, a hard metal, PTFE (polytetrafluoroethylene), gold, platinum and silver.

3. The LED chip testing device of claim 1, wherein the entire or a part of the mounting member is covered with a mirror coating, or plated with gold, platinum or silver.

4. The LED chip testing device of claim 1, wherein the mounting member includes:
a mounting body coupled to the rotation member; and
a contact member that comes into contact with the LED chip.

5. The LED chip testing device of claim 4, wherein the contact member is made of sapphire and a contact member's surface facing the mounting body is covered with a mirror coating.

6. The LED chip testing apparatus of claim 1, wherein the contact unit includes a detachable contact pin that is brought into contact with the LED chip.

7. The LED chip testing apparatus of claim 1, wherein the contact unit is a probe card.

8. The LED chip testing apparatus of claim 1, wherein the measurement unit is an integrating sphere having a light receiving hole through which the light emitted from the LED chip at the testing position is introduced into the inside of the integrating sphere.

9. The LED chip testing apparatus of claim 1, wherein the tester further includes a contact movement unit that moves the contact unit.

10. The LED chip testing device of claim 9, wherein the contact movement unit includes a contact rotation mechanism that rotates the contact unit.

11. The LED chip testing apparatus of claim 1, wherein the tester further includes a measurement elevation unit that elevates the measurement unit up and down.

* * * * *